(12) United States Patent
Shigyo et al.

(10) Patent No.: US 6,978,434 B1
(45) Date of Patent: Dec. 20, 2005

(54) METHOD OF DESIGNING WIRING STRUCTURE OF SEMICONDUCTOR DEVICE AND WIRING STRUCTURE DESIGNED ACCORDINGLY

(75) Inventors: Naoyuki Shigyo, Yokohama (JP); Tetsuya Yamaguchi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 1125 days.

(21) Appl. No.: 09/602,253

(22) Filed: Jun. 23, 2000

(30) Foreign Application Priority Data

| Jun. 25, 1999 | (JP) | ............................... H11-180572 |
| Sep. 22, 1999 | (JP) | ............................... H11-269511 |

(51) Int. Cl.$^7$ .................... G06F 17/50; H03K 19/003; H01L 29/06
(52) U.S. Cl. .............................. 716/13; 716/9; 716/10; 716/14; 326/15; 326/21; 326/101; 257/635; 257/649
(58) Field of Search ................................ 716/9, 10, 13, 716/14; 326/15, 21, 101; 257/635, 649

(56) References Cited

U.S. PATENT DOCUMENTS

| 4,626,889 | A | * | 12/1986 | Yamamoto et al. ......... 257/773 |
| 4,984,050 | A | * | 1/1991 | Kobayashi .................. 257/210 |
| 5,212,107 | A | * | 5/1993 | Suzuki et al. ............... 438/599 |
| 5,341,049 | A | * | 8/1994 | Shimizu et al. ............. 326/101 |
| 5,355,004 | A | * | 10/1994 | Saitoh ........................ 257/211 |
| 5,508,938 | A | * | 4/1996 | Wheeler ...................... 716/19 |
| 5,610,833 | A | * | 3/1997 | Chang et al. ................ 716/11 |
| 5,657,242 | A | * | 8/1997 | Sekiyama et al. ........... 716/15 |
| 5,661,334 | A | * | 8/1997 | Akram ........................ 257/632 |
| 5,675,187 | A | * | 10/1997 | Numata et al. ............. 257/758 |
| 5,850,102 | A | * | 12/1998 | Matsuno ..................... 257/635 |
| 5,990,557 | A | * | 11/1999 | Avanzino et al. ........... 257/758 |
| 6,054,872 | A | * | 4/2000 | Fudanuki et al. ............. 326/39 |
| 6,058,256 | A | * | 5/2000 | Mellen et al. ................ 716/12 |
| 6,083,821 | A | * | 7/2000 | Reinberg ..................... 438/619 |
| 6,104,092 | A | * | 8/2000 | Matsubara et al. ......... 257/764 |
| 6,163,066 | A | * | 12/2000 | Forbes et al. ............... 257/632 |
| 6,165,893 | A | * | 12/2000 | Chung ........................ 438/623 |
| 6,182,271 | B1 | * | 1/2001 | Yahagi ........................ 716/10 |
| 6,205,570 | B1 | * | 3/2001 | Yamashita .................... 716/1 |
| 6,207,987 | B1 | * | 3/2001 | Tottori ........................ 257/306 |
| 6,222,269 | B1 | * | 4/2001 | Usami ........................ 257/758 |
| 6,232,647 | B1 | * | 5/2001 | Lien et al. .................. 257/522 |
| 6,237,130 | B1 | * | 5/2001 | Soman et al. ................ 716/10 |
| 6,278,174 | B1 | * | 8/2001 | Havemann et al. ......... 257/637 |
| 6,311,313 | B1 | * | 10/2001 | Camporese et al. ........... 716/6 |
| 6,593,247 | B1 | * | 7/2003 | Huang et al. ............... 438/758 |
| 6,611,059 | B1 | * | 8/2003 | Manning ..................... 257/734 |
| 6,687,842 | B1 | * | 2/2004 | DiStefano et al. .......... 713/500 |

(Continued)

FOREIGN PATENT DOCUMENTS

| JP | 61152041 A | * | 7/1986 | ........... H01L 21/88 |

(Continued)

OTHER PUBLICATIONS

Yoshida, Masaaki (Japanese Patent No. JP 61160953 A, abstract only).*

(Continued)

*Primary Examiner*—Matthew Smith
*Assistant Examiner*—Phallaka Kik
(74) *Attorney, Agent, or Firm*—Finnegan, Henderson, Farabow, Garrett & Dunner, L.L.P.

(57) ABSTRACT

A wiring structure of a semiconductor device, includes a wiring layer formed on an insulating film, a width (W) of each wire in the wiring layer and a thickness (H) of the insulating film satisfying "W/H<1" a length (L) of each wiring in the wiring layer being equal to or longer than 1 mm.

2 Claims, 24 Drawing Sheets

U.S. PATENT DOCUMENTS

| | | | |
|---|---|---|---|
| 6,690,084 B1 * | 2/2004 | Mizuhara et al. | 257/650 |
| 6,713,847 B1 * | 3/2004 | Kobori | 257/637 |
| 6,719,919 B1 * | 4/2004 | Li et al. | 325/62.3 Q |
| 6,756,676 B2 * | 6/2004 | Oda et al. | 257/758 |
| 6,770,975 B2 * | 8/2004 | Wang et al. | 257/759 |
| 2001/0043080 A1 * | 11/2001 | Forbes et al. | 326/30 |
| 2001/0045623 A1 * | 11/2001 | Yuasa et al. | 257/646 |
| 2003/0030057 A1 * | 2/2003 | Bencher et al. | 257/77 |
| 2004/0159875 A1 * | 8/2004 | Li et al. | 257/306 |

FOREIGN PATENT DOCUMENTS

| | | | | |
|---|---|---|---|---|
| JP | 01239964 A | * | 9/1989 | H01L 21/88 |
| JP | 02084719 A | * | 3/1990 | H01L 21/285 |
| JP | 02291605 A | * | 12/1990 | H01B 3/42 |
| JP | 07029908 A | * | 1/1995 | H01L 21/3205 |
| JP | 09008036 A | * | 1/1997 | H01L 21/3205 |
| JP | 09231923 A | * | 9/1997 | H01J 31/12 |
| JP | 10247648 A | * | 9/1998 | H01L 21/3205 |
| JP | 01194393 A | * | 8/1999 | H05K 3/46 |

OTHER PUBLICATIONS

Chatterjee, "Device Modeling for Submicron FET Integrated Circuits", IEEE Transactions on Components, Hybrids, and Manufacturing Technology, vol. 5, No. 1, pp. 122-126.*

Kahn et al., "Interconnect optimization strategies for high-performance VLSI designs", Proceedings of Twelfth International Conference on VLSI Design, Jan. 7, 1999, pp. 464-469.*

Bohor, "Interconnect scaling-the real limiter to high performance ULSI", 1995 International Electron Devices Meeting, Dec. 10, 1995, pp. 241-244.*

Wall et al., "A new four-level metal interconnect system tailored to an advanced 0.5-um BiCMOS technology", IEEE Transactions on Semiconductor Manufacturing, vol. 11, No. 4, Nov. 1998, pp. 624-635.*

Hefner et al., "Reliability of polymide/nitrate dielectrics of multilevel metallization systems", Proceedings of Fifth International IEEE VLSI Multilevel Interconnect Conference, Jun. 13, 1988, pp. 476-483.*

Kahn et al., "Interconnect tuning strategies for high-performance ICs", Proceedings of Design, Automation and Test in Europe, Feb. 23, 1998, pp. 471-478.*

Robertson et al., "Multi-level transmission line circuits for MMICs", IEE Colloquium on Components for Novel Transmission Lines, Mar. 26, 1990, pp. 3/1-3/4.*

Wilson et al., "A high performance, four metal layer interconnect system for bipolar and BiCMOS circuits", Proceedings of Seventh International IEEE VLSI Interconnection Conference, Jun. 12, 1990, pp. 42-48.*

Buyn et al., "Enhanced EM endurance of TiN/AlCu/TiNx interconnection", 1994 International Integrated Reliability Workshop, Oct. 1, 1994, p. 144.*

Shen et al., "Laser linking of metal interconnects: analysis and design considerations", IEEE Transactions on Electron Devices vol. 43, No. 3, Mar. 1996, pp. 402-410.*

Elliott et al., "Electrical assessment of planarisation for CMP [inter-layer dielectrics]", Proceedings of IEEE International Conference on Microelectronic Test Structures, Mar. 17, 1997, pp. 85-90.*

Nakagawa, O.S. et al., "Circuit Impact and Skew-Corner Analysis of Stochastic Process Variation in Global Interconnect", IEEE 1999 International Interconnect Technology Conference, pp. 230-232, May 1999.

Orshansky, M. et al., "Circuit Performance Variability Decomposition", IWSM 1999, pp. 10-11.

Shigyo, N. "Statistical Simulation of Mosfet's Using TCAD: Meshing Noise Problem and Selection of Factors", International Workshop on Statistical Metrology Technical Papers, pp. 11-13, 1998.

Bakoglu, H.B., et al., "Optimal Interconnection Circuits for VLSI", IEEE Transactions on Electron Devices, vol. Ed.32, No. 5, May 1985.

Anand, M. B., Design of Optimized High Performance Interconnect Schemes For ULSI Devices, pp. 1-5, Feb. 1999.

Lin, "Sensitivity Study of Interconnect Variation Using Statistical Experimental Design," IEEE (1998), pp. 68-71.

Nakagawa et al., "Modeling of Pattern-Dependent On-Chip Interconnect Geometry Variation for Deep-Submicron Process and Design Technology," IEEE (1997), pp. 137-140.

Bohr, "Interconnect Scaling—The Real Limiter to High Performance ULSI," IEEE (1995), pp. 241-244.

* cited by examiner

FIG. 35

| INSULATING LAYER MATERIALS | DIELECTRIC CONSTANT:K(−) |
|---|---|
| SiN (Silicon Nitride) | 6.7 |
| BPSG (Boron-Phospho-Silicate Glass) | 4.2 |
| USG (Undoped Spin-on Glass) | 4.1 |
| SiO2 (Silicon Oxide) | 3.9 |
| PSG (Phospho-Silicate Glass) | 3.7 |
| FSG (Fluorine-doped Spin-on Glass) | 3.6 |
| HSQ (Hydrogen Silses Quioxane) | 3.2 |
| Polyimide Resin | 3.0≧ |

US 6,978,434 B1

METHOD OF DESIGNING WIRING STRUCTURE OF SEMICONDUCTOR DEVICE AND WIRING STRUCTURE DESIGNED ACCORDINGLY

The entire contents of Japanese Patent Applications H11-180572 (filed Jun. 25, 1999) and H11-269511 (filed Sep. 22, 1999) are incorporated herein by reference.

BACKGROUND OF THE INVENTION

1. Field of the Invention

The present invention relates to designing semiconductor devices, and particularly, to a method of designing wiring structures of LSIs and wiring structures designed accordingly.

2. Description of the Related Art

To increase the scale of LSIs, fine technology for LSI elements is improving. As LSI elements become smaller, process-originated variations occurring on LSI elements during, for example, patterning and ion-implanting processes become and not negligible in connection with the characteristics of LSIs. This is described in, for example, N. Shigyo et al., "Statistical of MOSFETs using TCAD: Meshing noise problem and selection of factors," Proc. IWSM98, p. 10, 1998.

One study based on sensitivity analyses about the influence of process-originated variations on the characteristics of a circuit is disclosed in Z. J. Lin and C. J. Sponos, "Sensitivity study of interconnect variation using statistical experimental design," Proc. IWSM, p. 68, 1998. Another study based on analytic formulas is disclosed in O. S. Nakagawa et al., "Modeling of pattern-dependent on-chip interconnect geometry variation for deep-submicron process and design technology," Tech. Dig. IEDM, p. 137, 1997.

One of the important characteristics of an LSI is a delay time. The delay time of an LSI circuit is given by the product RC of the resistance R and capacitance C of wiring of the circuit if the wiring is long. If the wiring is short, the dealy time of the circuit is the product RtrC of the transistor ON resistance Rtr and capacitance C of the wiring. This is described in H. B. Bakoglu and J. D. Meindl, "Optimal interconnection circuits for VLSI," IEEE Trans. Electron Devices, ED-32, p. 903, 1985. Namely, when considering characteristic of wiring, an important factor to determine the delay of an LSI circuit is the product RC of wiring of the circuit if the wiring is long, and it is the capacitance C of the wiring if the wiring is short.

When forming an LSI with fine elements, it is necessary to reduce the capacitance C and resistance-by-capacitance RC of wiring of the LSI. It is also necessary to suppress a capacitance variation ratio $\Delta C/C$ and resistance-by-capacitance variation ratio $\Delta(RC)/(RC)$ caused by process-originated variations. There is a need for a wiring structure having suppressed C and $\Delta C$ as well as suppressed RC and $\Delta(RC)/(RC)$.

The prior arts merely analyze the influence of process-originated variations on circuit characteristics, and there is no prior art that suggests or provides a guideline for a wiring structure capable of suppressing variation ratios $\Delta C/C$ and $\Delta(RC)/(RC)$ caused by process-originated variations.

SUMMARY OF THE INVENTION

An object of the present invention is to provide a method of designing a wiring structure of a semiconductor device such as an LSI, capable of suppressing variations in the capacitance C or resistance-by-capacitance RC of wiring of the semiconductor device caused by process-originated variations. Also provided are wiring structures based on the method.

In order to accomplish the objects, a first aspect of the present invention provides a method of designing a wiring structure of a semiconductor device. The method includes estimating a process-originated variation ratio ($\delta_P$) for the wiring structure, setting a tolerance ($\xi_c$) for a capacitance variation ratio ($\Delta C/C$) of the wiring structure, evaluating a fringe capacitance ratio ($F=C_F/C_P$) according to a fringe capacitance ($C_F$) and parallel-plate capacitance ($C_P$) of the wiring structure, and determining the wiring structure so that the fringe capacitance ratio F may satisfy the following:

$$F \geq \frac{\delta_P}{\xi_C} - 1$$

The wiring structure of the first aspect suppresses the ratio $\Delta C/C$ within the tolerance $\xi_C$.

If each wire in the wiring structure is shorter than 1 mm, the ratio $\Delta C/C$ greatly affects the delay time, and therefore, the first aspect is especially effective for semiconductor devices having such short wires.

A second aspect of the present invention provides a method of designing a wiring structure of a semiconductor device. The method includes estimating a process-originated variation ratio ($\delta_P$) for the wiring structure, setting a tolerance ($\xi_{RC}$) for a resistance-by-capacitance variation ratio ($\Delta(RC)/(RC)$) of the wiring structure, evaluating a fringe capacitance ration ($F=C_P/C_P$) according to a fringe capacitance ($C_F$) and parallel-plate capacitance ($C_P$) of the wiring structure, and determining the wiring structure so that the fringe capacitance ratio F may satisfy the following:

$$F \leq \frac{(1-\delta_P)\delta_P}{\delta_P - \xi_{RC}} - 1$$

The wiring structure of the second aspect suppresses the ratio $\Delta(RC)/(R)$ within the tolerance $\xi_{RC}$.

If each wire in the wiring structure is 1 mm or longer, the ratio $\Delta(RC)/(RC)$ greatly affects the delay time, and therefore, the second aspect is especially effective for semiconductor devices having such long wires.

A third aspect of the present invention provides a method of designing a wiring structure of a semiconductor device. The method includes estimating a process-originated variation ratio ($\delta_P$) for the wiring structure, setting a capacitance variation ratio ($\Delta C/C$) and resistance-by-capacitance variation ratio ($\Delta(RC)/(RC)$) of the wiring structure each to $\delta_P/2$, evaluating a fringe capacitance ratio ($F=C_P/C_P$) according to a fringe capaciatance ($C_F$) and parallel-plate capacitance ($C_P$) of the wiring structure, and determining the wiring structure so that the fringe capacitance ratio F may satisfy the following:

$$F = 1 - \delta_P$$

The wiring structure of the third aspect restricts the tolerance $\xi_C$ for the ratio $\Delta C/C$ and the tolerance $\xi_{RC}$ for the ratio $\Delta(RC)/(RC)$ each to half the ration $\delta_P$.

A fourth aspect of the present invention provides a wiring structure of a semiconductor device, having a wiring layer formed on an insulating film. The width W of each wire in the wiring layer and the thickness H of the insulating film satisfy "1≦W/H≦6," and the length of each wire in the wiring layer is shorter than 1 mm.

When the length of each wire in the wiring layer is shorter than 1 mm, a capacitance variation ratio ΔC/C of the wiring layer due to process-originated variations is a main factor to cause a delay. The wiring structure of the fourth aspect is effective to suppress such a delay. For a multilayer wiring structure, the fourth aspect is applicable to lower wiring layers having short wires.

A fifth aspect of the present invention provides a wiring structure of a semiconductor device, having a wiring layer formed on an insulating film. The width W of each wire in the wiring layer and the thickness H of the insulating film satisfy "W/H≦1," or "W/H≧6," and the length of each wire in the wiring layer is 1 mm or longer.

When the length of each wire in the wiring layer is 1 mm or longer, a resistance-by-capacitance variation ratio Δ(RC)/(RC) of the wiring layer due to process-originated variations is a main factor to cause a delay. The wiring structure of the fifth aspect is effective to suppress such a delay. For a multilayer wiring structure, the fifth aspect is applicable to upper wiring layers having long wires.

A sixth aspect of the present invention provides a wiring structure of a semiconductor device, having multiple wiring layers. The ratio W/T of the width W to thickness T of each wire in the first and second wiring layers is greater than the ratio W/T of each wire in the third and upper layers.

The length of each wire in the first and second layers is shorter than 1 mm, and therefore, a capacitance variation ratio ΔC/C of these wiring layers is a main factor to cause a delay. The length of each wire in the third and upper layers is 1 mm or longer, and therefore, a resistance-by-capacitance variation ratio Δ(RC)/(RC) of these wiring layers is a main factor to cause a delay. The sixth aspect is capable of suppressing both types of delay.

A seventh aspect of the present invention provides a wiring structure of a semiconductor device, having first and second wiring layers and a power-supply or clock-signal wiring layer between the first and second wiring layers.

The power-supply or clock-signal wiring layers serves as a shield plate to suppress crosstalk between the first and second wiring layers.

An eighth aspect of the present invention provides a wiring structure of a semiconductor device, having an intermediate wiring layer sandwiched between a power-supply wiring layer and a clock-signal wiring layer.

The power-supply wiring layer and clock-signal wiring layer serve as shield plates to suppress crosstalk between the intermediate wiring layer and other wiring layers.

A ninth aspect of the present invention provides a method of designing a wiring structure of a semiconductor device. The wiring structure includes copper wires each provided with a barrier metal layer along the side and bottom faces thereof. The method includes estimating a process-orginated variation ratio ($\delta_P$) for the wiring structure, setting a tolerance ($\xi_R$) for a resistance variation ratio (ΔR/R) of the wiring structure, and determining the wiring structure to satisfy the following:

$$\frac{T_P}{W} \leq 0.5\left[1 - \delta_P\left(1 - \frac{1}{\xi_R}\right)\right]$$

where $T_b$ is the thickness of the barrier metaly layer and W is the width of each copper wire.

The wiring structure of the ninth aspect suppresses the ratio ΔR/R within the tolerance $\xi_R$.

A tenth aspect of the present invention provides a method of designing a wiring structure of a semiconductor device. The wiring structure includes copper wires each provided with a barrier metal layer along the side and bottom faces thereof. The method includes estimating a process-originated variation ratio ($\delta_P$) for the wiring structure, setting a tolerance ($\xi_{RC}$) for a resistance-by-capacitance variation ratio (Δ(RC)/(RC)) of the wiring structure, evaluating a fringe capacitance ratio F(=$C_F/C_P$) according to a fringe capacitance $C_F$ and parallel-plate capacitance $C_P$ of the wiring structure, and determining the wiring structure to satisfy the following:

$$\frac{\delta_P}{1 - 2T_b/W + \delta_P}\left(1 + \frac{\delta_P}{1+F}\right) + \left(\frac{\delta_P}{1+F}\right) \leq \delta_{RC}$$

where $T_b$ is the thickness of the barrier layer and W is the width of each copper wire.

The wiring structure of the tenth aspect suppresses the ratio Δ(RC)/(RC) within the tolerance $\xi_{RC}$.

If the length of each copper wire is 1 mm or longer, the ratio ΔR/R is a main factor to cause a delay. This aspect is effective to suppress such a delay.

An 11th aspect of the present invention provides a wiring structure of a semiconductor device, having a wiring layer formed on an insulating film. The wiring layer includes copper wires each provided with a barrier metal layer along the side and bottom faces thereof. The width W of each copper wire and the thickness H of the insulating film satisfy "0.4≦W/H≦2."

This aspect is effective to suppress a delay if the delay is mainly dependent on the ratio Δ(RC)/(RC). If the length of each copper wire is 1 mm or longer, the ratio Δ(RC)/(RC) is a main factor to cause a delay, and the wiring structure of this aspect is effective to suppress such a delay.

A 12th aspect of the present invention provides a wiring structure of a semiconductor device, having multiple wiring layers each formed on an insulating film. The third and upper wiring layers include copper wires each provided with a barrier metal layer along the side and bottom faces thereof. The width W of each copper wire and the thickness H of the insulating film just under the copper wire satisfy "0.4≦W/H≦2."

The length of each wire in the third and upper wiring layers is 1 mm or longer, and therefore, the ratio Δ(RC)/(RC) is a main factor to cause a delay in these layers. The wiring structure of the 12th aspect is effective to suppress such a delay.

A 13th aspect of the present invnetion provides a method of designing a wiring structure of a semiconductor device, including finding relationships among the cross-sectional-shape parameters of each wire in the wiring structure to satisfy an equivalent-variations condition, and determining the cross-sectional-shape parameters of each wire in the wiring structure so that a capacitance variation ratio ΔC/C and resistance-by-capacitance variation ratio Δ(RC)/(RC) of the wiring structure may balance with each other at a given level.

The "equivalent-variations condition" is a condition to minimize the ratios ΔC/C and Δ(RC)/(RC). Namely, the equivalent-variations condition is a condition to achieve |ΔC/C|=|Δ(RC)/(RC)|. The equivalent-variations condition has universaity for a process-originated variation ratio $\delta_W/\delta_T$. The equivalent-variations condition is a new concept to serve a technical index or a design criterion for evaluating the ratios $\Delta C/C$ and $\Delta(RC)/(RC)$. The equivalent-variations condition is useful to easily determine a wiring structure that suppresses the ratios $\Delta C/C$ and $\Delta(RC)/(RC)$.

A CAD tool incorporating an algorithm for finding an equivalent-variations condition is useful to efficiently determine an optimum wiring structure.

A 14th aspect of the present invention provides a wiring structure of a semiconductor device, having multiple wiring layers each formed on an insulating layer and having wires each of 1 mm or longer. The dielectric constant of an insulating layer between horizontally adjacent ones of the wires is higher than the dielectric constant of an insulating layer between vertically adjacent ones of the wires.

The insulating layer between vertically adjacent wires is an insulating layer formed between two wiring layers or between a wiring layer and a substrate.

The dielectric constant of an insulating layer is a mean dielectric constant of the insulating layer. If the insulating layer is a single layer, the dielectric constant thereof is the dielectric constant of the material of the insulating layer. If the insulating layer consists of multiple layers, the dielectric constant thereof is a mean dielectric constant of the multiple layers.

The 14th aspect increases a coupling capacitance between horizontally adjacent wires, to suppress the resistance-by-capacitance variation ratio $\Delta(RC)/(RC)$ of each wiring layer.

The insulating layer between horizontally adjacent wires may have a part whose dielectric constant is higher than that of the insulating layer between vertically adjacent wires, to increase a mean dielectric constant of the insulating layer between horizontally adjacent wires higher than that of the insulating layer between vertically adjacent wires.

Partly providing the insulating layer between horizontally adjacent wires with a material having a high dielectric constant widens a selection range of dielectric materials. The width of the material of high dielectric constant is adjustable to control relationships among the dielectric constants of wiring layers.

This aspect is achievable by forming an insulating film having a high dielectric constant during the side wall of each wire.

According to the 14th aspect, each wire may be made of material whose specific resistance is lower than that of aluminum (Al). This helps reduce the aspect ratio (thickness-to-width ratio T/W) of each wire to simultaneously suppress the $\Delta(RC)/(RC)$ and RC of the wiring structure. The material whose specific resistance is lower than that of aluminum may be copper (Cu).

A 15th aspect of the present invention provides a wiring structure of a semiconductor device, having multiple wiring layers each formed on an insulating layer and having wires each shorter than 1 mm. The dielectric constant of an insulating layer between vertically adjacent ones of the wires is higher than the dielectric constant of an insulating layer between horizontally adjacent ones of the wires.

The 15th aspect increases wire-to-ground capacitance and suppresses a capacitance variation ratio $\Delta C/C$ of the wiring structure in response to process-originated variations.

The insulating layer between vertically adjacent wires may partly be provided with an insulating layer whose dielectric constant is higher than that of the insulating layer between horizontally adjacent wires, so that a mean dielectric constant of the insulating layer between vertically adjacent wires becomes a higher than the dielectric constant of the insulating layer between horizontally adjacent wires.

Since the insulating layer between vertically adjacent wires is only partly provided with a layer having a high dielectric constant, the 15th aspect has a wide range of dielectric materials to be selected. The width of the partial layer of high dielectric constant is adjustable to control relationships among the dielectric constants of wiring layers.

The wires of the 15th aspect may be made of a conductive material whose specific resistance is lower than that of aluminum (Al). This helps improve the aspect ratio (thickness-to-width ratio T/W) of each wire to simultaneously suppress the capacitance C and capacitance variation ratio $\Delta C/C$ of the wiring structure. The material whose specific resistance is lower than that of aluminum may be copper (Cu).

A 16th aspect of the present invention provides a wiring structure of a semiconductor device, having an upper wiring structure and a lower wiring structure. In the upper wiring structure, the dielectric constant of an insulating layer between horizontally adjacent wires is higher than that of an insulating layer between vertically adjacent wires. In the lower wiring structure, the dielectric constant of an insulating layer between vertically adjacent wires is higher than that of an insulating layer between horizontally adjacent wires.

In the upper wiring structure, the 16th aspect increases coupling capacitance between horizontally adjacent wires, to suppress a resistance-by-capacitance variation ratio $\Delta(RC)/(RC)$ of wiring structure in response to process-originated variations. In the lower wiring structure, the 16th aspect increases wire-to-ground capacitance, to suppress a capacitance variation ratio $\Delta C/C$ of the wiring structure in response to process-originated variations.

The upper wiring structure includes the third and upper wiring layers counted from a substrate, and the lower wiring structure includes the first and second wiring layers.

Any of the wiring layers may have wires whose main component is copper. If the upper wiring structure employs copper wires, the aspect ratio (thickness-to-width ratio T/W) of each wire will be decreased to simultaneously suppress the $\Delta(RC)/(R)$ and RC of the wiring structure. If the lower wiring structure employs copper wires, the aspect ratio (thickness-to-width ratio T/W) of each will be increased to simultaneously suppress the C and $\Delta C/C$ of the wiring structure.

A given one of the wiring layers may have wires whose main component is copper (Cu), and wiring layers above the given wiring layer may have wires mainly made of aluminum (Al). This is effective to form the fine wires of proper aspect ratio in lower wiring layers.

A 17th aspect of the present invention provides a wiring structure of a semiconductor device, having multiple wiring layers. Two wiring layers that may cause crosstalk are separated from each other with another wiring layer being interposed between them.

The 17th aspect separates wiring layers that may cause crosstalk from each other, to suppress crosstalk and improve the reliability of the semiconductor device.

BRIEF DESCRIPTION OF THE DRAWINGS

FIG. 35 is a table showing dielectric materials usable to form insulating layers.

DESCRIPTION OF THE PREFERRED EMBODIMENTS

<First embodiment>

The first embodiment relates to a method of designing a wiring structure in consideration of fringe capacitance.

An outline of the method will be explained. The inventors of the present invention have analyzed the prior arts in connection with reducing the capacitance C and resistance-by-capacitance RC of a wiring structure and have found that suppressing the influence of process-originated variations on C and RC is important.

Also clarified by the inventors is that the capacitance variation ratio ΔC/C and resistance-by-capacitance variation ratio Δ(RC)/(RC) of a wiring structure conflict with each other due to fringe capacitance ($C_F$) to be produced at the periphery of the wiring structure.

Figure 1:
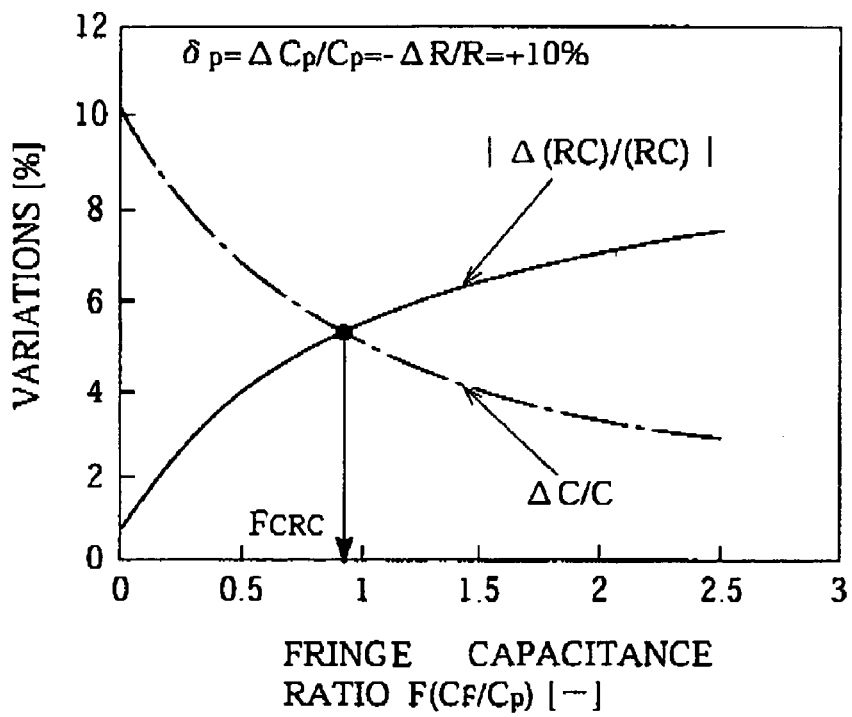
FIG. 1 is a graph showing relationships among the capacitance variation ratio $\Delta C/C$, resistance-by-capacitance variation ratio $\Delta(RC)/(RC)$, and fringe capacitance ratio F of a wiring structure with a process-originated variation ratio $\delta_P$ being 10%.

FIG. 1 is a graph showing relationships among the ratios ΔC/C, Δ(RC)/(RC), and F of a writing structure with a process-originated variation ratio $\delta_P$ of 10%. Here, "F" is a fringe capacitance ratio and is equal to $C_F/C_P$ where $C_F$ is fringe capacitance of the wiring structure and $C_P$ is parallel-plate capacitance of the wiring structure. As F increases, ΔC/C is more suppressed. As F decreases, Δ(RC)/(RC) is more suppressed.

The inventors have found an equation to calculate a proper fringe capacitance ratio F for a wiring structure according to a process-originated variation ratio $\delta_P$ estimated for the wiring structure and a tolerance $\xi_C$ for a capacitance C of the wiring structure or a tolerance $\xi_{RC}$ for a resistance-by-capacitance RC of the wiring structure. To restrict ΔC/C within $\xi_C$ and Δ(RC)/(RC) within $\xi_{HC}$, F must satisfy the followings:

$$\text{For } \left|\frac{\Delta C}{C}\right| \leq \xi_C, \quad F \geq \frac{\delta_P}{\xi_C} - 1 \quad (1)$$

$$\text{For } \left|\frac{\Delta(RC)}{RC}\right| \leq \xi_{RC}, \quad F \leq \frac{(1-\delta_P)\delta_P}{\delta_P - \delta_{RC}} - 1 \quad (2)$$

The fringe capacitance ratio F and a capacitance simulator are used to determine a proper wiring structure. For a wiring structure employing short wries, a larger F is selected to suppress $\Delta C/C$. For a wiring structure employing long wires, a smaller F is selected to suppress $\Delta(RC)/(RC)$.

If $\Delta C/C$ and $\Delta(RC)/(RC)$ must both be suppressed, the fringe capacitance ratio F is set to "$1-\delta_P$" to suppress $\Delta C/C$ and $\Delta(RC)/(RC)$ each to half the ratio $\delta_P$. In FIG. 1 where $\delta_P$ is 10%, $\Delta C/C$ and $\Delta(RC)/(RC)$ are equally suppressed if F is set to $F_{CRC}(=0.9)$ corresponding to an intersection of two curves shown in FIG. 1.

Example 1

The first embodiment will be explained in more detail.

Figure 2:
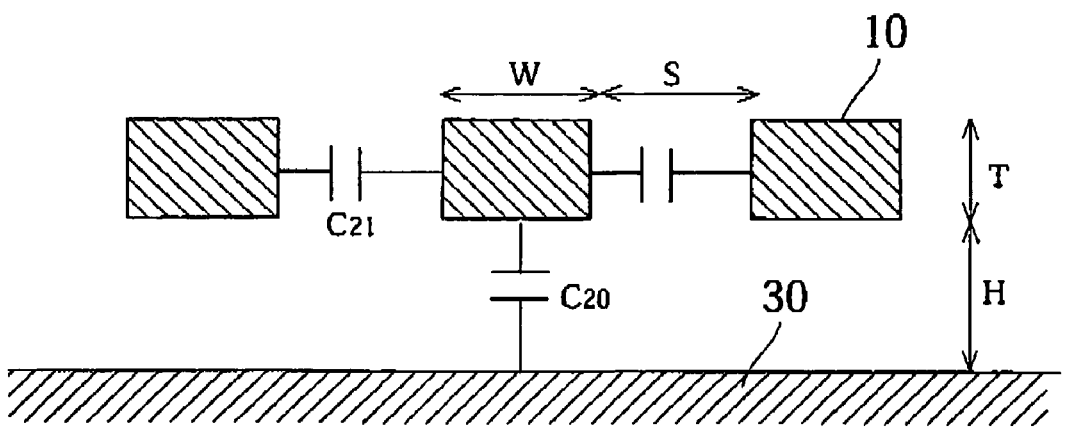
FIG. 2 is a sectional view showing a model of a wiring structure having wires arranged at regular intervals.

FIG. 2 is a sectional view showing a model of a wiring structure in which wires are arranged at regular intervals in a wiring layer. The wiring layer is formed on an insulating layer that is formed on a substrate. The wires are covered with insulating layers. "S" is a space between adjacent wires, "H" is the thickness of the insulating film between the wiring layers and the substrate, "T" is the thickness of each wire, and "W" is the width of each wire. The wires are arranged at regular intervals, the "W+S" is fixed. Dimensions are normalized based on H because two-dimensional capacitance is determined by its shape but not by size. The ratio T/H is fixed at 0.6. Wiring capacitance C is calculated by two-dimensional simulation.

Figure 3:
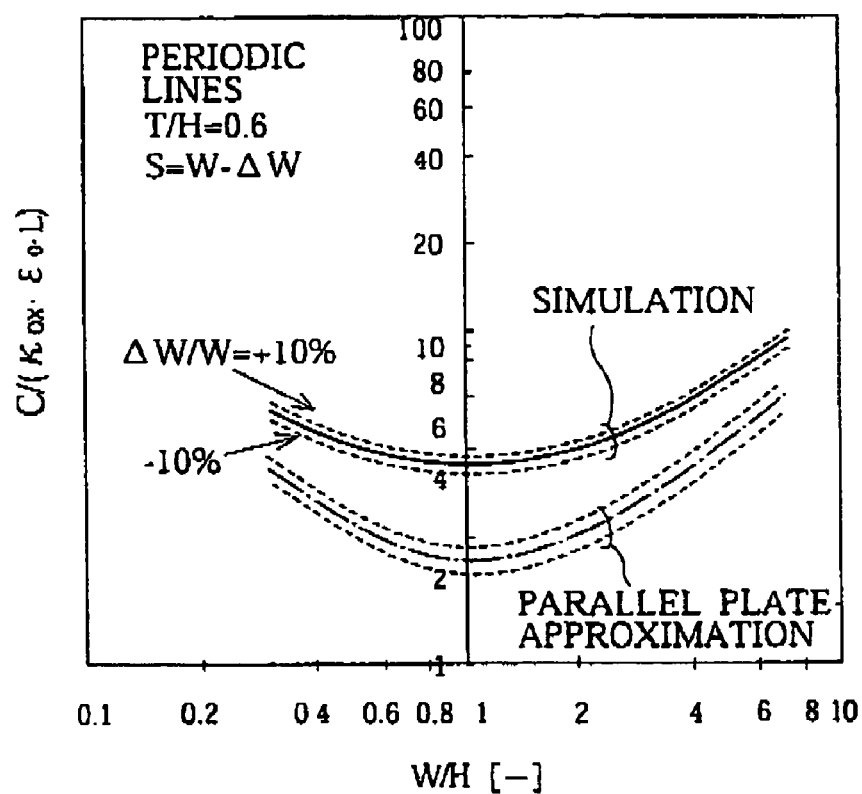
FIG. 3 is a graph showing relationships between the capacitance C and width-to-insulation thickness ratio W/H of a wiring structure with a variation in W being +10% to −10%, in which a continuous line is obtained by simulation that consider fringe capacitance and a dotted line is obtained by parallel-plate approximation that considers no fringe capacitance.

FIG. 3 shows the relationship between the capacitance C and ratio W/H of the wiring structure with a variation in the wire width W being +10% to −10% due to process-originated variations. The values of C were calculated by simulations and by parallel-plate approximation. The parallel-plate approximation employs wire-to-ground capacitance $C_{20}$ and wire-to-wire capacitance $C_{21}$ as follows:

$$C_{21}/(\kappa_{ox} \cdot \epsilon_o \cdot L) = W/H$$

$$C_{21}/(\kappa_o \cdot E_o \cdot L) = T/S$$

Namely, the parallel-plate approximation considers no fringe capacitance. Each capacitance value is normalized according to a dielectric constant $\kappa_{ox} \cdot \epsilon_o$ and wire length L. Where W is large, $C_{20}$ becomes predominant, and when W is small, $C_{21}$ becomes predominant. In FIG. 3, a continous line represents nominal wiring capacitance values, and dotted lines represent wiring capacitance values when a variation of W is +10% to −10%.

Figure 4:
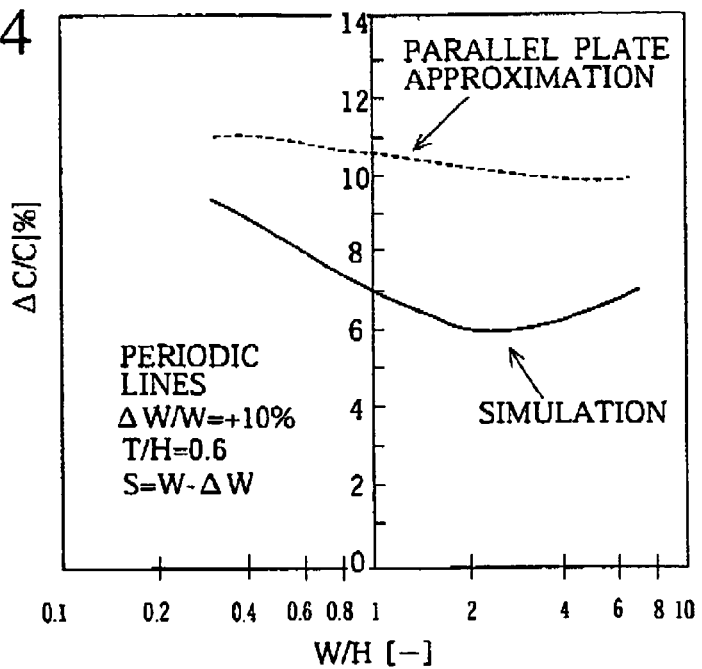
FIG. 4 is a graph showing relationships between the ratios ΔC/C and W/H of a wiring structure with a variation in W being +10%, in which a continuous line is obtained by simulations that consider fringe capacitance and a dotted line is obtained by parallel-plate approximation that considers no fringe capacitance.

FIG. 4 shows the relationship between the ratios $\Delta C/C$ and W/H of the wiring structure with a variation in the wire width W being +10% due to process-originated variation. When W/H is around 3, $\Delta C/C$ is minimum. The values of $\Delta C/C$ calculated by the parallel-plate approximation are always about 10%. The difference between the simulations and the parallel-plate approximation is whether or not fringe capacitance is considered. The fringe capacitance relaxes $\Delta C/C$ against a change in W. Namely, the fringe capacitance makes a change in $\Delta C/C$ dull agains a change in W. It is understood that W/H must be around 2 to suppress $\Delta C/C$.

Setting W/H to 2, however, is the worst for the resistance-by-capacitance variation ratio $\Delta(RC)/(RC)$.

Figure 5:
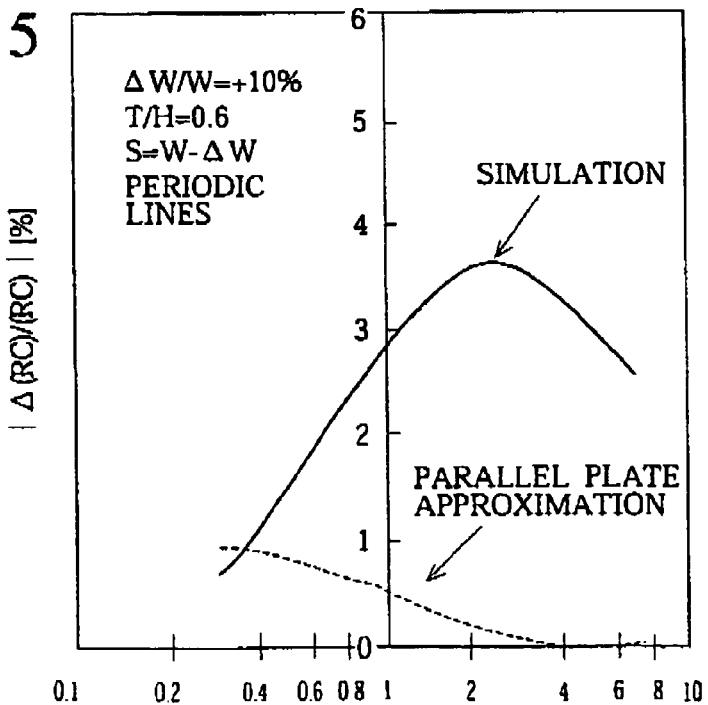
FIG. 5 is a graph showing relationships between the ratios Δ(RC)/(RC) and W/H of a wiring structure with a variation in W being +10%, in which a continous line is obtained by simulations that consider fringe capacitance and a dotted line is obtained by parallel-plate approximation that considers no fringe capacitance.

FIG. 5 shows the relationship between the absolute values of the ratios $|\Delta(RC)/(RC)|$ and W/H of the wiring structure in consideration of wire resistance R. The resistance R of a wire is in inverse proportion to the cross-section area WT of the wire. If the wire width W is extremely large or small, $|\Delta(RC)/(RC)|$ decreases. Namely, if W is extremely large or small, the wiring structure of FIG. 2 shows only a small change in $|\Delta(RC)/(RC)|$ in response to a change in W. If W/H is around 2, $|\Delta(RC)/(RC)|$ is maximum (nearly 4%). Namely, setting W/H to 2 is the worst for $|\Delta(RC)/(RC)|$. Values of $|\Delta(RC)/(RC)|$ calculated by the parallel-plate approximation area always below 1%.

In this way, a change in the width W of a wire oppositely influences the resistance R and capacitance C of the wire. Namely, the ratios $\Delta R/R$ and $\Delta C/C$ of a wire cancel each other (negative correlation). When the width W of a wire becomes smaller, the resistance R of the wire increases and the wire-to-ground capacitance $C_{20}$ decreases. When W becomes smaller, the space S between adjacent wires becomes larger to reduce the wire-to-wire capacitance $C_{21}$ because "W+S" is unchanged. In a simplified case where the parallel-plate approximation is established, a variation of RC will be zeroed.

$$\frac{\Delta(RC)}{RC} = \frac{(R+\Delta R)(C+\Delta C) - RC}{RC} = \frac{\Delta R}{R} + \frac{\Delta C}{C} + \frac{\Delta R \Delta C}{RC}$$

If the parallel-plate approximation is established, $\Delta R/R + \Delta C/C = 0$.

When preparing a wiring structure having fine wires, the structural factors such as W, S, H, and T (FIG. 2) of each wire make $\Delta(RC)/(RC)$ increase or decrease. This is because the wiring structure involves fringe capacitance to hinder the establishment of the parallel-plate approximation. In the wiring structure haivng fine wires, the fringe capacitance relaxes $\Delta C/C$ in connection with the wire-to-ground capacitance $C_{20}$ so that $\Delta C/C$ scarcely changes in response to a change in W, thereby directly providing the influence of $\Delta R/R$. For further fine wires, the wire-to-wire capacitance $C_{21}$ meets the parallel-plate approximation to provide $\Delta R/R = -\Delta C/C$, thereby zeroing a change in RC.

Figure 6:
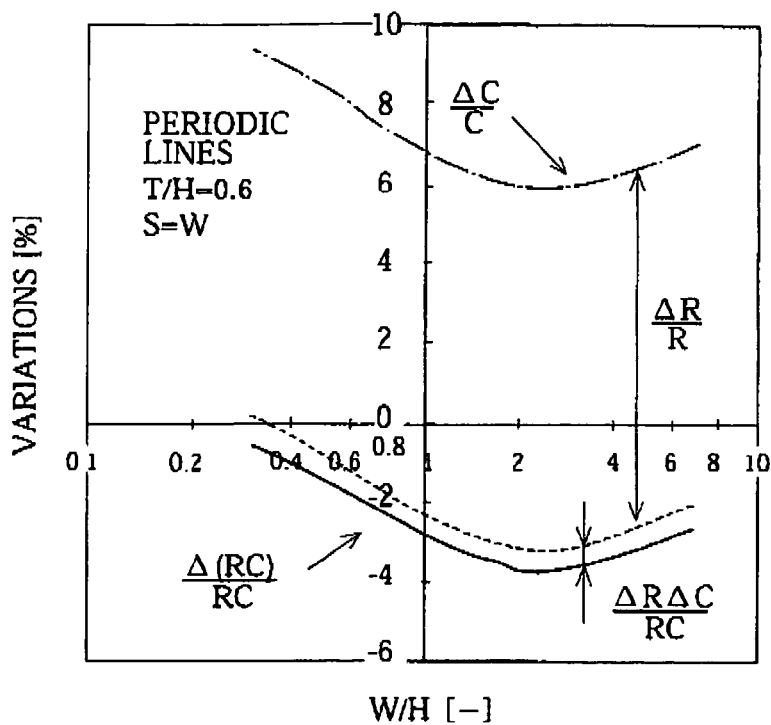
FIG. 6 is a graph showing relationships between the ratios Δ(RC)/(RC) and W/H of a wiring structure.

FIG. 6 shows components of the above equation with W being increased by 10%. $\Delta C/C$ is the same as that of FIG. 4. $\Delta R/R$ is simply calculated from the cross-sectional area of a wire, is in inverse proportion to W, and is constant. $\Delta R/R$ and $\Delta C/C$ have opposite signs to cancel each other. When W/H is around 2, $\Delta C/C$ is small due to the fringe capacitance and is unalbe to cancel $\Delta R/R$, thereby increasing $|\Delta(RC)/(RC)|$. As a result, RC varies widely with respect to a variation $\Delta W$ in the wire width W.

The wiring structure will analytically be explained with reference to equations. The capacitance C of the wiring structure consists of a parallel-plate capacitance component $C_P$ and a fringe capacitance component $C_F$ as follows:

$$C = C_P + C_F = (1+F)C_P$$

wherein F is a fringe capacitance ratio and is equal to $C_F/C_P$.

The following two assumptions are made:
(i) A fringe capacitance variation $\Delta C_F$ is negligibly smaller than a parallel-plate capacitance variation $\Delta C_P$ as follows:

$$\Delta C_F \ll \Delta C_P$$

(ii) A parallel-plate variation ratio and a resistance variation ratio cancel each other, and the absolute value of a parallel-plate variation ratio is equal to a process-originated variation ratio $\delta_P$ as follows:

$$\frac{\Delta C_P}{C_P} = -\frac{\Delta R}{R} = \delta_P \quad (3)$$

Based on these assumptions, the capacitance variation ratio $\Delta C/C$ of the wiring structure is expressed as follows with the use of the fringe capacitance ratio F:

$$\frac{\Delta C}{C} = \frac{\Delta C_P}{C_P + C_F} = \frac{1}{1+F} \cdot \frac{\Delta C_P}{C_P} \quad (4)$$

The resistance-by-capacitance variation ratio $\Delta(RC)/(RC)$ of the wiring structure is expressed as follows:

$$\frac{\Delta(RC)}{(RC)} = \frac{\Delta R}{R} + \frac{\Delta C}{C} + \frac{\Delta R \Delta C}{RC} = \frac{\Delta R}{R} + \frac{1}{1+F}\frac{\Delta C_P}{C_P}\left(1+\frac{\Delta R}{R}\right) \quad (5)$$

This is expressed as follows in consideration of the expression (3):

$$\frac{\Delta(RC)}{(RC)} = -\left[1 - \frac{1}{1+F}(1-\delta_P)\right]\delta_P \quad (6)$$

To suppress $\Delta C/C$ and $\Delta(RC)/(RC)$ within tolerances $\xi$ and $\xi_{RC}$, respectively, the fringe capacitance ratio F must satisfy the followings:

$$\text{For } \left|\frac{\Delta C}{C}\right| \le \xi_C, \quad F \ge \frac{\delta_P}{\xi_C} - 1 \quad (1)$$

$$\text{For } \left|\frac{\Delta(RC)}{RC}\right| \le \xi_{RC}, \quad F \ge \frac{(1-\delta_P)\delta_P}{\delta_P - \delta_{RC}} - 1 \quad (2)$$

where the process-originated variation ratio $\delta_P$ set for the wiring structure is as follows:

$$\delta_P = \Delta C_P/C_P = -\Delta R/R$$

This is a proper assumption for variations in the width W and thickness T of each wire in the wiring structure. If $\delta_P$ is 0.1 (10%), the fringe capacitance ratio F must be 1 or over to realize $\xi_C = 0.05$ (5%). On the other hand, the fringe capacitance ratio F must be 0.8 or below to realize $\xi_{RC} = 0.05$ (5%).

FIG. 1 shows relationships among the capacitance variation ratio $\Delta C/C$, resistance-by-capacitance variation ratio $|\Delta(RC)/(RC)|$, and fringe capacitance ratio F of a wiring structure. $\Delta C/C$ and $\Delta(RC)/(RC)$ have opposite signs, and in FIG. 1, $\Delta(RC)/(RC)$ has a negative sign and is represented with absolute values. As F increases, $\Delta C/C$ decreases and $|\Delta(RC)/(RC)|$ increases. This agrees with the conclusion mentioned above. If $\delta_P$ is 0.01 (10%) for the wiring structure of FIG. 2, F must be 1 or above to realize $\xi_C = 0.05$ (5%). On the other hand, F must be 0.8 or below to realize $\xi_{RC} = 0.05$ (5%).

Example 2

This example relates to a wiring structure capable of simultaneously reducing, to some extent, the capacitance variation ratio $\Delta C/C$ and resistance-by-capacitance variation ratio $\Delta(RC)/(RC)$ of the wiring structure caused by process-originated variations.

The capacitance variations ratio $\Delta C/C$ and resistance-by-capacitance variation ratio $\Delta(RC)/(RC)$ of a wiring structue contradict with each other, and therefore, it is difficult to simultaneously suppress them. It is possible, however, to simultaneously suppress them to some extent. As shown in FIG. 1, this is realized by establishing the fringe capacitance ratio $F_{CRC}$ corresponding to the intersection of the two curves of $\Delta C/C$ and $|\Delta(RC)/(RC)|$. $F_{CRC}$ is expressed as follows according to the expression (4) and (6):

$$F_{CRC} = 1 - \delta_P \quad (7)$$

At this time, the tolerances $\xi_C$ and $\xi_{RC}$ for $\Delta C/C$ and $\Delta(RC)/(RC)$ are approximated as follows if $\delta_P << 2$:

$$\xi_C = \xi_{RC} = \frac{\delta_P}{2}$$

By using $F_{CRC}$, $\Delta C/C$ and $|\Delta(RC)/(RC)|$ are suppressed to $\delta_P/2$. At the intersection of the two curves of FIG. 1, F ($F_{CRC}$)=0.9 and $\delta_P$ is 10%. Accordingly, $\Delta C/C$ and $|\Delta(RC)/(RC)|$ are each suppressed to about 5%.

Figure 7:
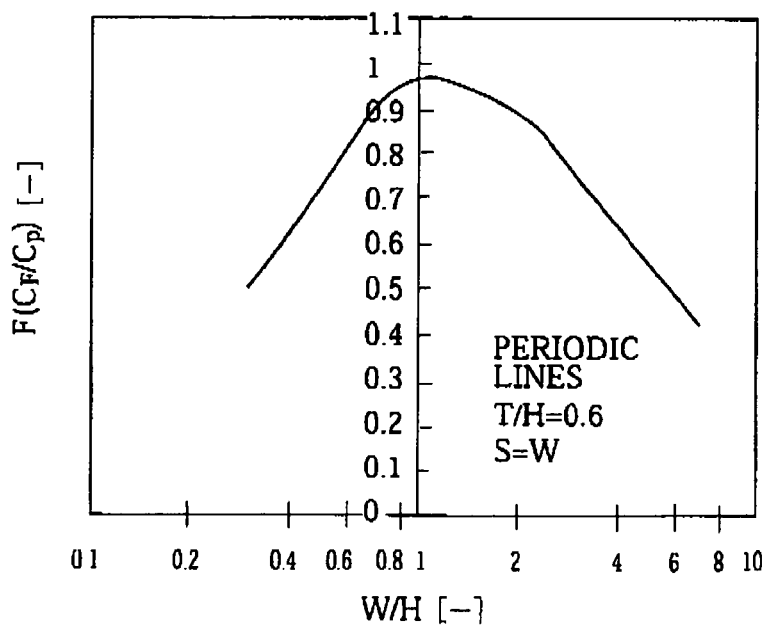
FIG. 7 is a graph showing a relationships between the ratios F ($=C_F/C_P$) and W/H of the wiring structure of FIG. 2.

FIG. 7 shows the relationship between the ratios F and W/H of the wiring structure of FIG. 2. When W/H is around 1, F is at the peak and is approximately 1. $F_{CRC}$ of 0.9 is attained when W/H is 0.7 or 2. W/H becomes 0.7 by setting, for example, W=S=0.25 μm, H=0.36 μm, and T=0.22 μm.

Figure 8:
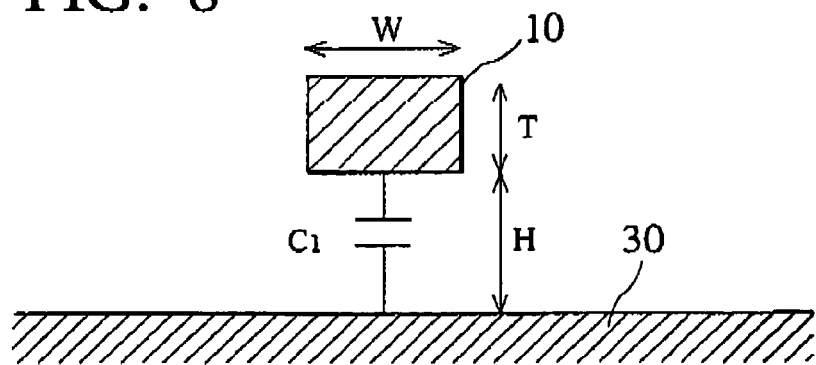
FIG. 8 is a sectional view showing a model of a wiring structure having a single wire.
Figure 9:
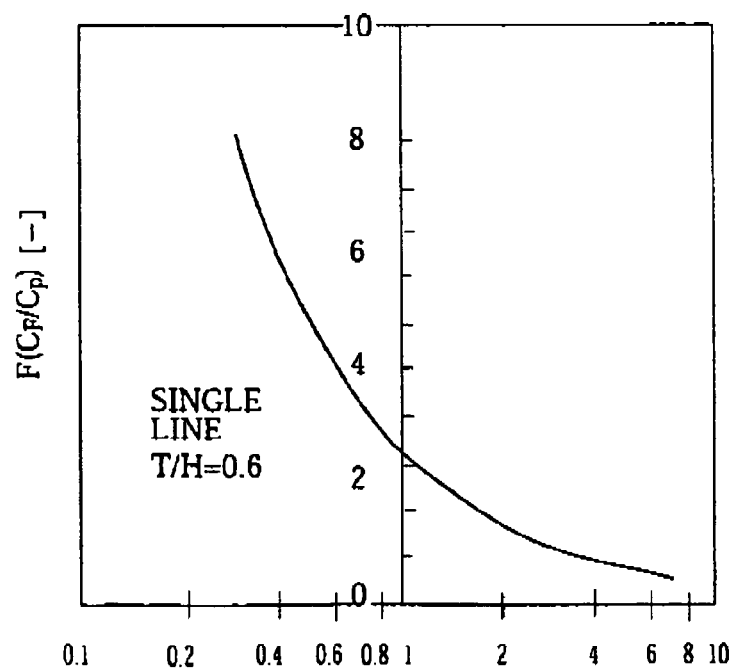
FIG. 9 is a graph showing relationships between the ratios F ($=C_F/C_P$) and W/H of the wiring structure of FIG. 8.

FIG. 8 shows a model of a wiring structure having a single wire. FIG. 9 shows the relationship between the fringe capacitance ratio F and wire-width-to-insulating-film-thickness ratio W/H of the wiring structure of FIG. 8. To determine a single-wire structure that satisfies required specifications, the fringe capacitance ratio F of FIG. 9 and the expressions (1), (2), and (7) are used.

Example 3

This example relates to a method of designing a wiring structure having long and short wires.

For a wire of 1 mm or longer, a delay time is determined by the product RC of the resistance R and capacitance C of the wire. For a wire of shorter than 1 mm, a delay time is determined by RtrC, when Rtr is the transistor ON resistance. These matters are described in M. R. Anand, "Design of optimized high performance interconnect schemes for ULSI device," Ph. D. Dissertation, Waseda Univ., p. 4, 1999. Namely, it is important to suppress RC for a wire of 1 mm or longer, and to suppress C for a wire shorter than 1 mm.

For a wiring structure having wires each of 1 mm or longer, it is important to suppress a resistance-by-capacitance variation ratio $\Delta(RC)/(RC)$ in response to process-originated variations. For a wiring structure having wires each shorter than 1 mm, it is important to suppress capacitance variation ratio $\Delta C//C$ in response to process-originated variations.

More precisely, for a wiring structure having long wires, it is necessary to select a small fringe capacitance ratio F to suppress $\Delta(RC)/(RC)$. For a wiring structure having short wires, it is necessary to select a large fringe capacitance ratio F to suppress $\Delta C/C$.

In FIG. 4, for a wiring structure having wires each shorter than 1 mm, ΔC/C is suppressed to 7% or below against a wire width variation ratio (corresponding to the process-originated variation ratio) ΔW/W of 10% by setting "1≦W/H≦6" where W is the width of each wire and H is the thickness of an insulating film laid under the wires. In FIG. 5, for a wiring structure having wires each of 1 mm or longer, Δ(RC)/(RC) is suppressed by setting "W/H≦1," or "W/H≧6."

Example 4

This example relates to a method of designing a multilayer wiring structure.

Generally, a multilayer wiring structure forms short wires in lower layers and long wires in upper layers. Accordingly, wires in the first and second layers counted from a substrate are designed to suppress a capacitance variatin ratio ΔC/C, and wires in the third and upper layers are designed to suppress a resistance-by-capacitance variation ratio Δ(RC)/(RC).

In FIG. 4, for wires in the first and second layers, the width W of each wire and the thickness H of an insulating film laid under the wires are set to "1≦W/H≦6" to suppress ΔC/C. In FIG. 5, for wires in the third and upper layers, Δ(RC)/(RC) is suppressed to 3% or below by setting "W/H≦1," and "W/H≧6."

Figure 10:
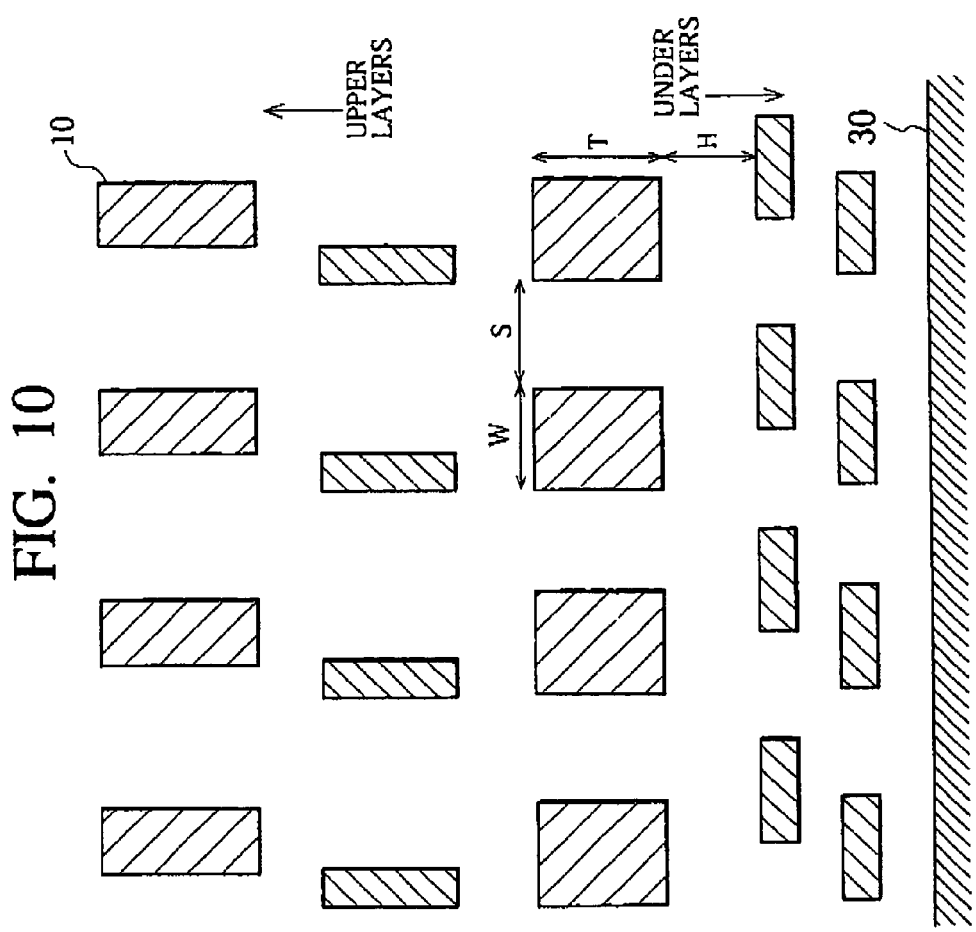
FIG. 10 is a sectional view showing a wiring structure consisting of lower first and second wiring layers having short wires to suppress ΔC/C and upper wiring layers having long wires to suppress Δ(RC)/(RC)

FIG. 10 shows a resultant multilayer wiring structure in which W/T of each wire in the second layer is greater than W/T of each wire in the third layer where W is the width of a wire and T is the thickness of the wire.

Example 5

This example relates to a method of designing a multilayer wiring structure in consideration of crosstalk.

Figure 11:
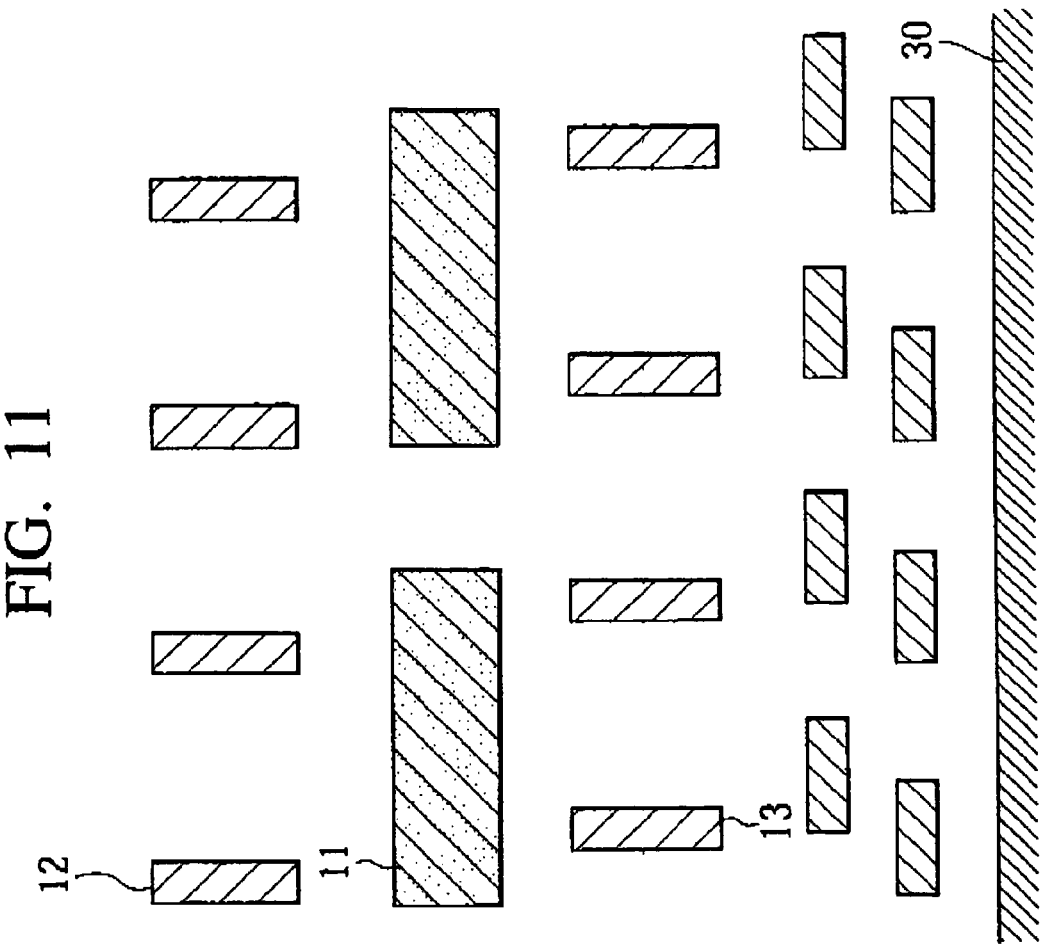
FIG. 11 is a sectional view showing a wiring structure having no power supply wires at the top thereof, to suppress crosstalk.

A multilayer wiring structure involves a problem of crosstalk due to coupling capacitance between vertically adjacent wires. To prevent the crosstalk, FIG. 11 shows a power-supply or clock-signal wiring layer 11 interposed between wiring layers that are not power-supply or clock-signal wiring layers. The power-supply or clock-signal wiring layer 11 serves as a shield plate to suppress crosstalk between an upper wiring layer 12 and a lower wiring layer 13.

Figure 12:
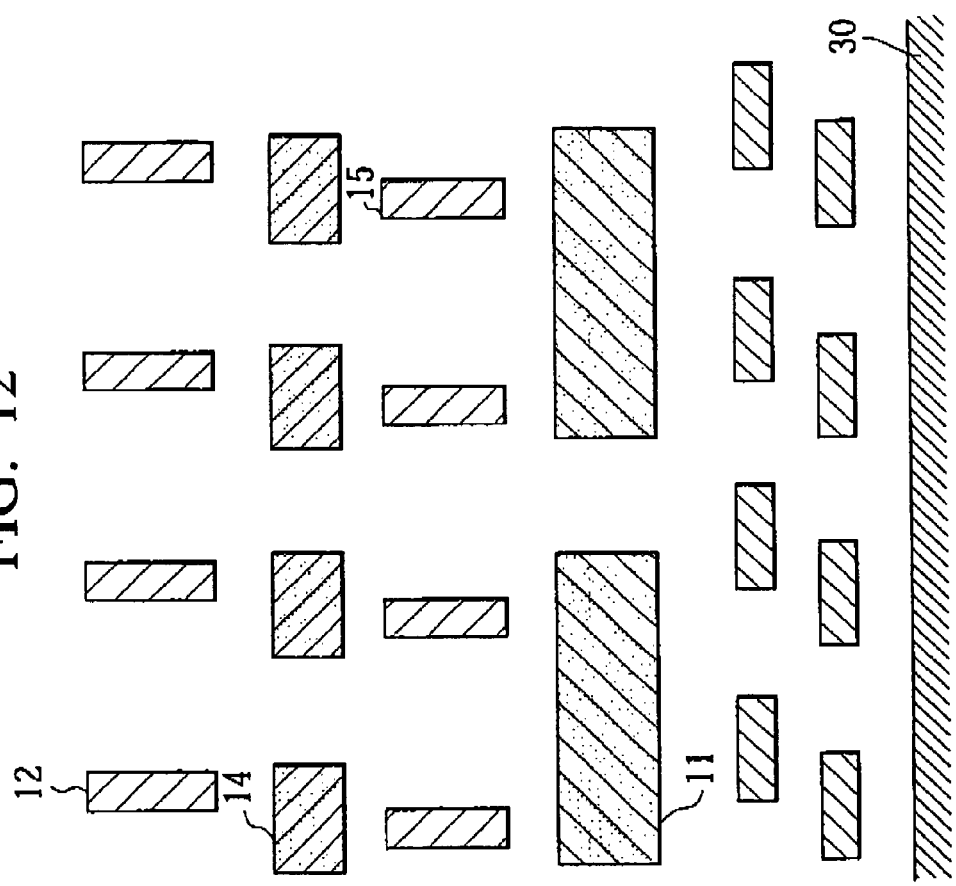
FIG. 12 is a sectional view showing a wiring structure that sandwiches a critical wiring layer between a power-supply wiring layer and a clock-signal wiring layer to shield the critical wiring layer and prevent crosstalk.

FIG. 12 shows power-supply or clock-signal wiring layers 11 and 14 that sandwich a wiring layer 15. The wiring layer 15 is not a power-supply or clock-signal wiring layer. In this case, the wiring layers 11 and 14 serve as shield plates to suppress crosstalk related to the wiring layer 15.

<Second embodiment>

The second embodiment relates to a method of designing a wiring structure employing copper (Cu) wires.

To reduce wiring resistance, wiring structures may employ copper wires having low specific resistance. When employing copper wires, it is usual to form a barrier metal layer along the side and bottom faces of each copper wire, to prevent diffusion. This is disclosed in M. T. Bohr, "Interconnect scaling the real limiter to high performance ULSI," Tech. Dig. 1995 IEDM, p. 241.

Figure 13:
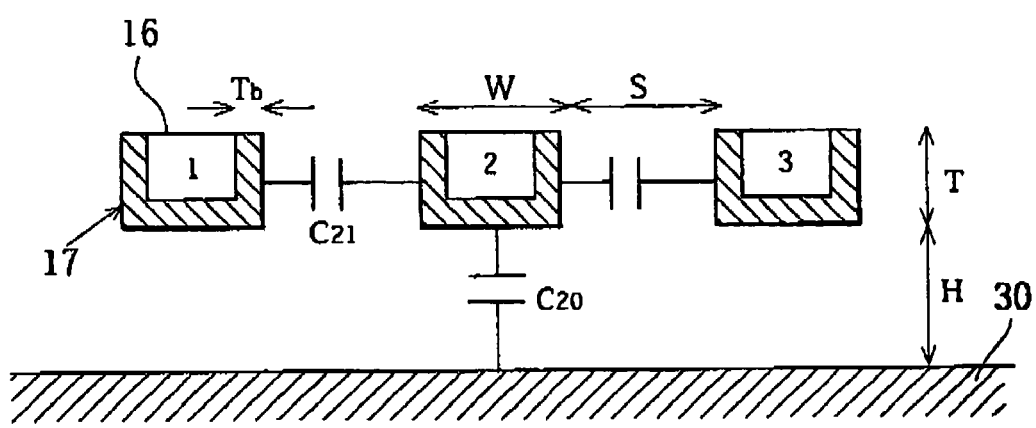
FIG. 13 is a sectional view showing a model of a wiring structure in which copper wires are arranged at regular intervals with each copper wire having a barrier metal layer along the side and bottom faces thereof.

FIG. 13 shows a model of a wiring structure employing copper wires formed at regular intervals with each copper wire having a barrier metal layer.

Figure 14:
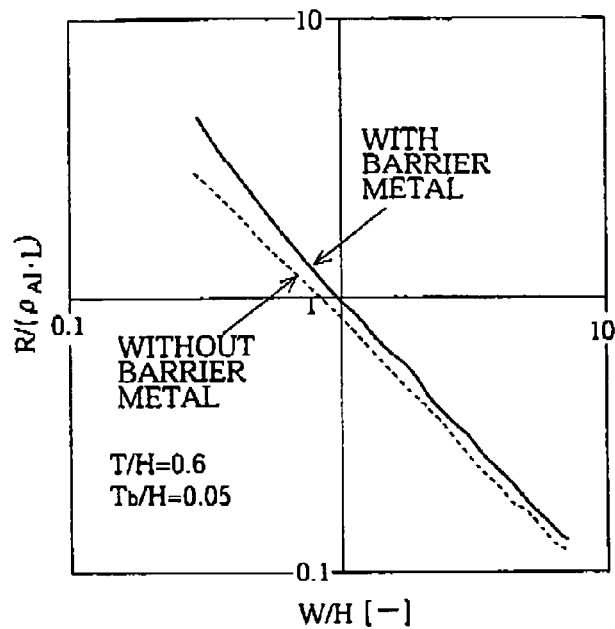
FIG. 14 is a graph showing the difference in resistance R between a copper wire with a barrier metal layer and a copper wire without the same.

When such a barrier metal layer is used for a copper wire, an effective cross-sectional area of the copper wire is reduced. Although the resistivity of copper is almost half the resistivity of aluminum (Al). The effect of the barrier metal layer is shown in FIG. 14 and becomes clearer when the width W of a copper wire is small. A resistance variation ratio ΔR/R of the wiring structure having copper wires is expressed as follows:

$$\left|\frac{\Delta R}{R}\right| = \frac{\delta_P}{1 - 2T_b/W + \delta_P}$$

$T_b$ is the thickness of a barrier metal layer formed on each copper wire and is usually in the range of 10 to 20 mm.

The ratio ΔR/R of the wiring structure having copper wires each with the barrier metal layer is restricted within a tolerance $\xi_R$ if $T_b/W$ satisfies the following:

$$\text{For } \left|\frac{\Delta R}{R}\right| \leq \xi_R, \quad \frac{T_b}{W} \leq 0.5\left[1 - \delta_P\left(1 - \frac{1}{\xi_R}\right)\right] \quad (8)$$

To suppress resistance-by-capacitance variation ratio Δ(RC)/(RC) of the wiring structure having copper wires within a tolerance $\xi_{RC}$, $T_b/W$ and a fringe capacitance ratio F must satisfy the following:

$$\frac{\delta_P}{1 - 2T_b/W + \delta_P}\left(1 + \frac{\delta_P}{1+F}\right) + \frac{\delta_P}{1+F} \leq \xi_{RC} \quad (9)$$

where $\delta_P$ is a process-originated variation ratio set for the wiring structure.

The wiring structure of FIG. 13 will be explained in more detail. "S" is a horizontal space between adjacent wires, "H" is the thickness of an insulating film formed under the wires, and "T" is the thickness of the wire. "W+S" is fixed, and "T/H" is fixed at 0.6. $T_b$ is the thickness of the barrier metal layer.

FIG. 14 is a graph showing the relationship between the resistance R and W/H of wires with and without the barrier metal layer. If there is no barrier metal, R is in inverse proportion to W, i.e., R is in proportion to 1/W. If there is a barrier metal layer of $T_b/H=0.05$. R rapidly increases as W becomes thinner. This means that the effective cross-sectional area of a wire rapidly decreases as W becomes thinner.

Figure 15:
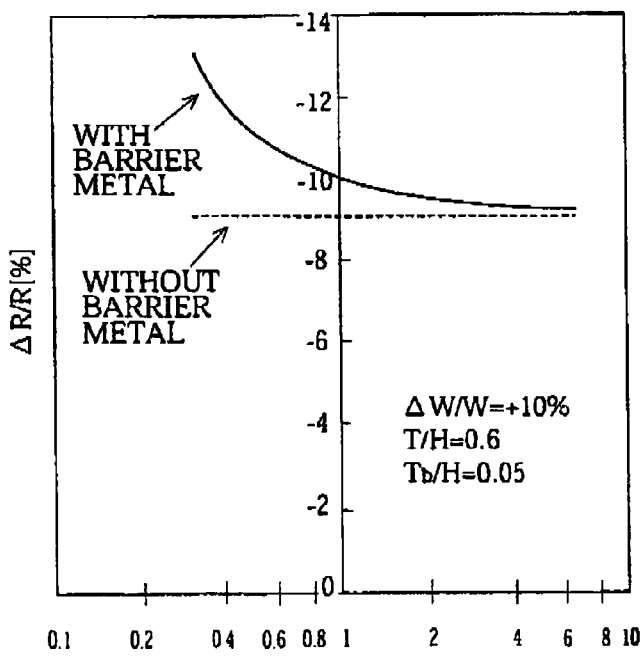
FIG. 15 is a graph showing relationships between the ratios ΔR/R and W/H of a wiring structure with a variation in W being +10%.

FIG. 15 is a graph showing the relationship between the resistance variation ratio ΔR/R and W/H of each copper wire and with W being increased by +10% due to process-originated variations. As W becomes thinner, the resistance R more quickly increases than 1/W to quickly increase ΔR/R.

If the process-originated variations involve only a wire width variation ΔW in the width W of each wire and if the resistance R is in inverse proportion to the cross-sectional area of the wire, ΔR/R is expressed as follows:

$$\left|\frac{\Delta R}{R}\right| = \frac{\delta_P}{1 - 2T_b/W + \delta_P}$$

where $\delta_P = \Delta W/W$. Accordingly, the copper wire having the barrier metal layer must satisfy the following, to restrict ΔR/R within a tolerance $\xi_R$:

$$\text{For } \left|\frac{\Delta R}{R}\right| \leq \xi_R, \quad \frac{T_b}{W} \leq 0.5\left[1 - \delta_P\left(1 - \frac{1}{\xi_R}\right)\right] \quad (8)$$

To restrict $\Delta(RC)/(RC)$ within a tolerance $\xi_{RC}$, the following must be satisfied:

$$\frac{\delta_P}{1 - 2T_b/W + \delta_P}\left(1 + \frac{\delta_P}{1+F}\right) + \frac{\delta_P}{1+F} \leq \xi_{RC} \quad (9)$$

where $\delta_P$ is a process variation ratio and F is a fringe capacitance ratio.

Figure 16:
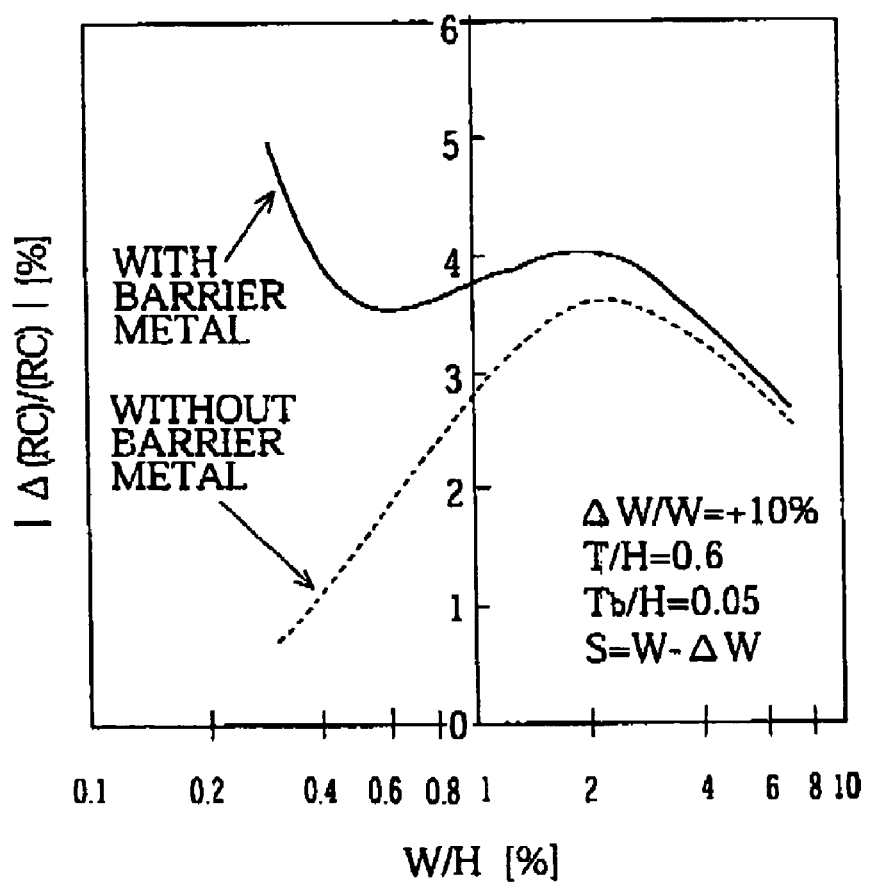
FIG. 16 is a graph showing the difference in Δ(RC)/(RC) and W/H between a copper wire with a barrier metal layer and a copper wire without the same, with a variation in W being +10%.

FIG. 16 is a graph showing the relationship between the $\Delta(RC)/(RC)$ and W/H of a copper wire in the wiring structue with the capacitance C of the wire being calculated according to two-dimensional simulations and with a wire width variation ratio $\Delta W/W$ due to process-originated variations being 10%.

If each wire is 1 mm or longer, the product RC of the resistance R and capacitance C of the wire determines a circuit operation. In this case, it is necessary to suppress $\Delta(RC)/(RC)$. In FIG. 16, $\Delta(RC)/(RC)$ of the copper wire having the barrier metal layer is suppressed below 4% if $0.4 \leq W/H \leq 2$.

A multilayer wiring structure usually has short wires in lower layers and long wires in upper layers. Accordingly, wires in the first and second layers in a multilayer wiring structure are designed to mainly suppress capcitance variations, and wires in the third and upper layer are designed to mainly suppress resistance-by-capacitance variations.

Namely, copper wires each having a barrier metal layer arranged in the third and upper layers are formed to satisfy $0.4 \leq W/H \leq 2$, to suppress $\Delta(RC)/(RC)$ below 4%. Here, "W" is the width of each copper wire and "H" is the thickness of an insulating film laid under the wires.

<Third Embodiment>

The third embodiment relates to a method of designing a wiring structure based on the new concept of "equivalent-variations."

The equivalent-variations concept has been created from the analyses of capacitance variation ratio $\Delta C/C$ and resistance-by-capacitance variation ratio $\Delta(RC)/(RC)$ of a wiring structure. The equivalent-variations concept has universailty and provides a technical index when designing a wiring structure. A wiring structure based on the equivalent-variations concept is capable of simultaneously suppressing capacitance C, capacitance variation ratio $\Delta C/C$, resistance-by-capacitance RC, and resistance-by-capacitance variation ratio $\Delta(RC)/(RC)$ related to the wiring structure.

The equivalent-variations concept will be explained. By ignoring second-order infinitesimal quantities $(\Delta C/C) \cdot (\Delta R/R)$, the capacitance variation ratio $\Delta C/C$ and resistance-by-capacitance variation ratio $\Delta(RC)/(RC)$ of a wiring structure are expressed as follows:

$$\Delta(RC)/(RC) = (\Delta C/C) + (\Delta R/R)$$

The signs of $\Delta C/C$ and $\Delta R/R$ are always opposite to each other. A condition to simultaneously minimize $|\Delta C/C|$ and $|\Delta(RC)/(RC)|$ to establish $|\Delta C/C| = |\Delta(RC)/(RC)|$ is defined as an equivalent-variations condition.

Since $\Delta C/C$ and $\Delta(RC)/(RC)$ always have opposite signs, the equivalent-variations condition is expressed as follows:

$$2 \times \Delta C/C = -\Delta R/R \quad (11)$$

C_rc ($\Delta RC$ suppression) is defined as a condition to suppress $|\Delta(RC)/(RC)|$ below $|\Delta C/C|$, and c_RC ($\Delta C$ suppression) is defined as a condition to suppress $|\Delta C/C|$ below $|\Delta(RC)/(RC)|$. Then a conditional expression for C_rc is $2 \times \Delta C/C > -\Delta R/R$, and a condition expression for c_RC is $2 \times \Delta C/C < -\Delta R/R$.

A wire width variation ratio $\Delta W/W$ is $\delta_W$ and a wire thickness variation ratio $\Delta T/T$ is $\delta_T$. For example, if W varies in the range of =10%, then $\delta_W$=0.1. These are expressed as follows:

$$\Delta R = \frac{1}{(T \pm \Delta T)(W \pm \Delta W)} - \frac{1}{T \cdot W}$$

Accordingly, the following is established:

$$\Delta R/R = (\Delta R/R)_{PP} - (\Delta R/R)_{mm} \quad (12)$$
$$= -\frac{\delta_W + \delta_T + \delta_W \delta_T}{(1+\delta_W)(1+\delta_T)} - \frac{\delta_W + \delta_T - \delta_W \delta_T}{(1-\delta_W)(1-\delta_T)}$$
$$= -2 \cdot (\delta_W + \delta_T)$$

where $(\Delta R/R)_{PP}$ indicates that W and T vary in a positive direction due to process-originated variations and $(\Delta R/R)_{mm}$ indicates that W and T vary in a negative direction due to process-originated variations. $(\Delta R/R)_{PP}-(\Delta R/R)_{mm}$ provides a maximum variation (the worst case) for $\Delta R/R$.

According to the expression (12), $\Delta R/R$ is always a fixed value, and if second-order infinitestimal values are ignored, is equal to $-2(\delta_W+\delta_T)$.

A function $Fn_{EV}$ is defined as follows:

$$Fn_{EV} = \left|\frac{\Delta C}{C}\right| - (\delta_W + \delta_T)$$

The function $Fn_{EV}$ is useful for simplication.

Namely, if $Fn_{EV}>0$, then C_rc, and if $Fn_{EV}<0$, then c_RC. $Fn_{EV}=0$ is the equivalent-variations condition.

The following important conclusions are derived. According to the expression (13), a variation ratio provided by the equivalent-variations condition of $Fn_{EV}=0$ is equal to "$\delta_W+\delta_T$." When process-originated variations cause the wire width W to vary by $\pm\delta_W$ % and cause the wire thickness T to vary to $\delta_T$ %, a variation ratio provided by the equivalent-variations condition of $Fn_{EV}=0$ is equal to $(\delta_W+\delta_T)$ %.

The equation $Fn_{EV}=0$ for the equivalent-variations condition has universality for $\delta_W$ and $\delta_T$. This will be explained.

The equation for the equivalent-variations conditoin is expressed as follows according to the expression (11) and the expression (12):

$$\Delta C/C = -\frac{\Delta R/R}{2} = \delta_W + \delta_T \quad (14)$$

Substitutions are made as x=W/H and y=T/H. The wiring capacitance C is a function of only W/H and T/H. Although there is a variable S/H, it is not considered as a variable in this explanation because a wiring pitch of "W+S" is fixed. Accordingly, C=f(W/H, T/H)=f(x, y). Then, the following is established:

$$\Delta C_{PP} = f(x + \delta_{Wx}, y + \delta_{Wy}) - f(x, y) = \frac{\delta f}{\delta x} \cdot \delta_{W\lambda} + \frac{\delta f}{\delta x} \cdot \delta_{wy} \quad (15)$$

$$\Delta C_{mm} = f(x - \delta_{Wx}, y - \delta_{Wy}) - f(x, y) = \frac{\delta f}{\delta x} \cdot \delta_{W\lambda} + \frac{\delta f}{\delta x} \cdot \delta_{wy} \quad (16)$$

According to the expressions (14) to (16), the following is established:

$$\delta_W + \delta_T = \frac{\Delta C}{C} = \frac{\Delta C_{PP} - \Delta C_{mm}}{C} = 2 \times \frac{\frac{\delta f}{\delta x} \cdot \delta_{Wx} + \frac{\delta f}{\delta x} \cdot \delta_{Wy}}{f}$$

A substitution is made as $Pf = \delta_w/\delta_r$, and each side of the above equation is divided by $\delta_T$ to obtain the following:

$$\frac{Pf + 1}{2} = \frac{Pf \cdot \frac{\delta f}{\delta x} \cdot x + \frac{\delta f}{\delta x} \cdot y}{f}$$

This equation is dependent only on the process variation ratio Pf. This provies that the equivalent-variations condition has universality.

The equivalent-variations condition is applicable as a criterion when designing a wiring structure. It is required to make resistance-by-capacitance (RC) variations smaller than capacitance (C) variations when designing a wiring structue involving long wires. In this case, the designing is carried out with $Fn_{EV} < 0$. It is required to make C variations smaller than RC variations when designing a wiring structure involving short wires. In this case, the designing is carried out with $Fn_{EV} > 0$. It is required to evenly suppress C and RC variations when designing a wiring structure involving wires of an average length. In this case, the designing is carried out with $Fn_{EV} = 0$.

Example 1

This example relates to a method of designing a wiring structure according to the equivalent-variations concept.

The example will be explained based on the wiring structure of FIG. 2 involving wires arranged at regular intervals. In FIG. 2, "W" is the width of each wire, "S" is a horizontal space between adjacent wires, "H" is the thickness of an insulating layer formed under the wires, and "T" is the thickness of the wire. A wiring pitch, i.e., "W+S" is fixed. For primary approximation, T is normalized according to H, and no scaling is carried out because two-dimensional capacitance is determined by shape but not by size.

The wires are made of aluminum (Al) and the insulating layer is made of an oxide film ($SiO_2$).

Figure 17:
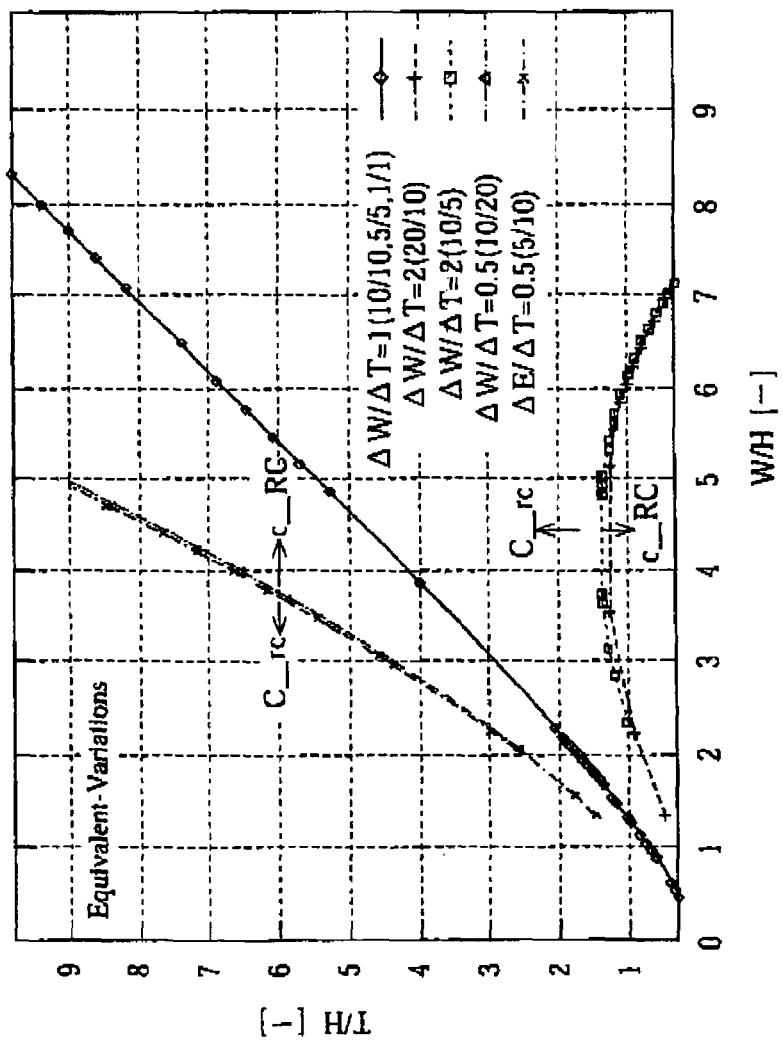
FIG. 17 is a graph showing the universality of equivalent-variations condition.
Figure 18:
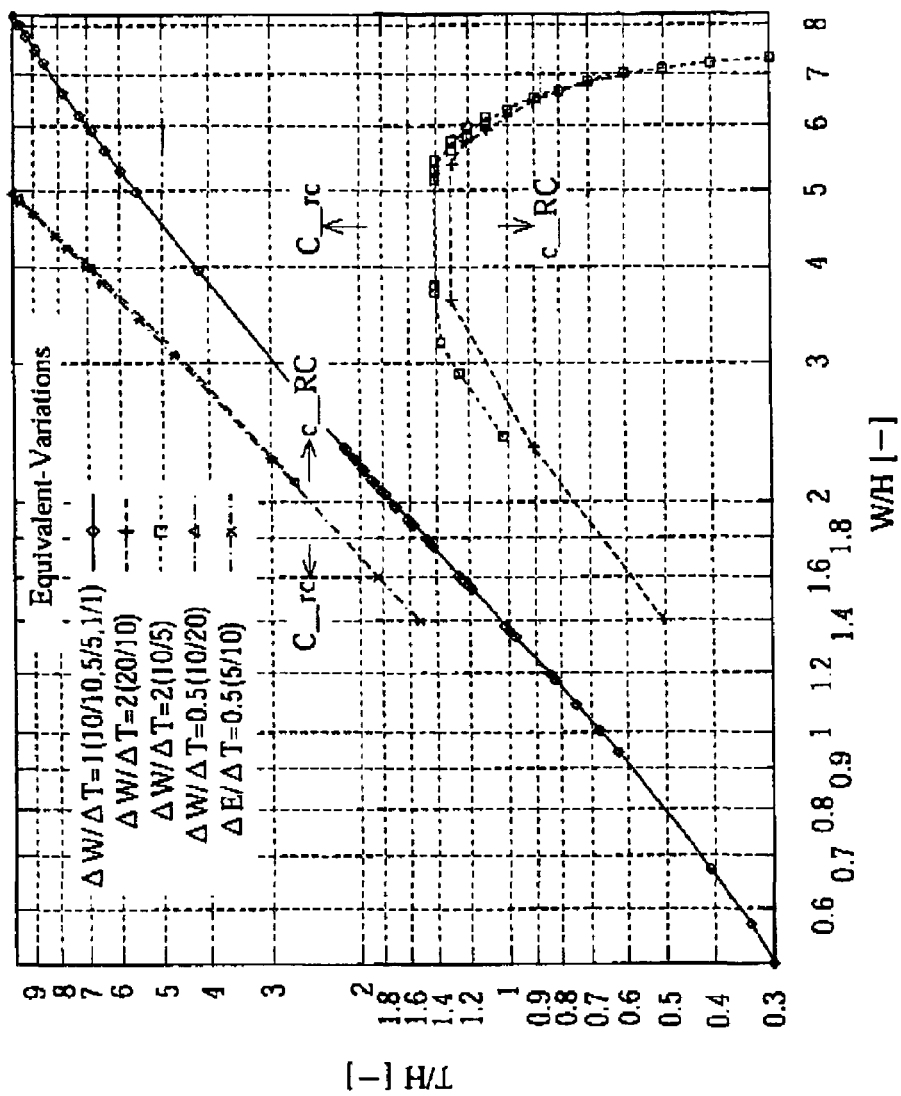
FIG. 18 is a log-log graph showing the equivalent-variations condition of FIG. 17.

FIG. 17 is a graph showing the equivalent-variations condition for the wiring structure of FIG. 2. FIG. 18 is a log-log graph based on the graph of FIG. 17. Each plot corresponds to a pair of W/H and T/H that satisfies the equivalent-variations condition of $Fn_{EV} = 0$.

Before the present invention, there was no technical guideline for attesting a wiring structure that may suppress $\Delta C/C$ (c_RC) or $\Delta(RC)/(RC)$ (C_rc). In FIGS. 17 and 18, the equivalent-variation condition of $Fn_{EV} = 0$ serves as a boundary to separate c_RC and C_rc regions from each other. It is possible, therefore, to select optimum design conditions that meet requirements. As is apparent in FIGS. 17 and 18, the equivalent-variations condition has universality.

The data of FIGS. 17 and 18 is obtainable by simulations and analyses and is used to determine a wiring structure that suppresses $\Delta C/C$ and $\Delta(RC)/(RC)$.

A test element group (TEC) of wires having different sizes are formed on a chip, to actually measure $\Delta C/C$ and find the equivalent-variations condition of $Fn_{EV} = 0$. This technique is useful to find the equivalent-variations condition for an optional wiring structure.

An algorithm for finding the equivalent-variations condition may be incorporated in a CAD tool. The CAD tool is used to extract the equivalent-variation condition for various wiring patterns, to efficiently estimate an optimum wiring structure. The wiring structure thus designed causes little variations in the characteristics thereof against process-originated variations.

<Fourth Embodiment>

The first to third embodiments relate to designing a wiring structure that suppresses the capacitance variation ratio $\Delta C/C$ or resistance-by-capacitance variation ratio $\Delta(RC)/(RC)$ caused by process-originated variations. The fourth embodiment designs a wiring structure that suppresses both the capacitance variation ratio $\Delta C/C$ and capacitance C of the wiring structure, or the resistance-by-capacitance variation ratio $\Delta(RC)/(RC)$ and resistance-by-capacitance RC of the wiring structure.

Example 1

This example relates to a method of designing a wiring structure involving long wires, to simultaneously suppress $\Delta(RC)/(RC)$ and RC.

A delay in an LSI circuit is mainly dependent on the resistance-by-capacitance RC of a wiring structure of the LSI circuit if the wiring structure involves wires equal to or longer than 1 mm. Namely, the performance of a wiring structure having long wires is determined by the resistance-by-capacitance RC and resistance-by-capacitance variation ratio $\Delta(RC)/(RC)$ of the wiring structure. Accordingly, the wiring structure must suppress RC and $\Delta(RC)/(RC)$.

A wiring structure having wires made of aluminum (Al) and insulating layers made of $SiO_2$ will be explained in terms of suppressing RC and $\Delta(RC)/(RC)$.

In the following explanation, the width of each wire involves a variation $\Delta W$ of ±10% and the thickness of each wire involves a variation $\Delta T$ of =10%.

Figure 19:
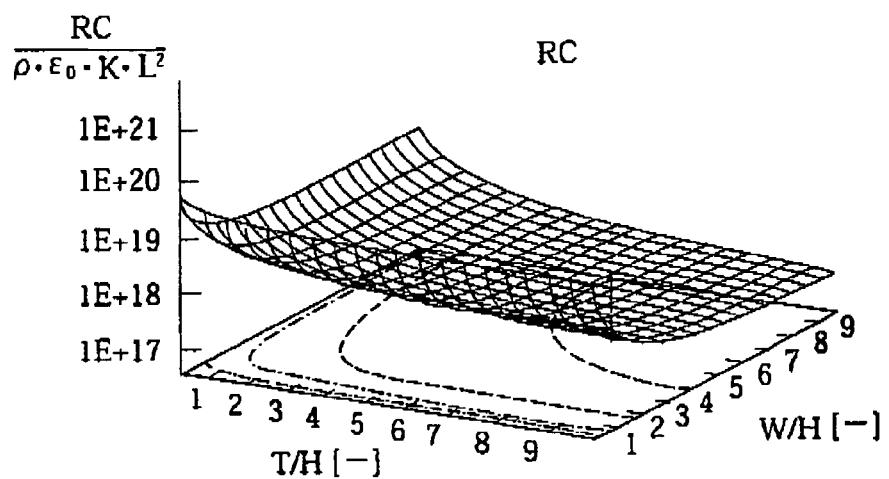
FIG. 19 is a three-dimensional graph showing relationships among the RC, W/H, and T/H of a wiring structure.

FIG. 19 is a graph showing wiring delay values for different W/H and T/H values in a wiring structure. An x-axis represents T/H values, a y-axis W/H values, and a z-axis RC values. "W" is the width of each wire, "H" is the thickness of an insulating layer formed under the wires, and "T" is the thickness of each wire. The RC values are normalized according to $\rho \cdot \kappa_{ox} \cdot E_\omega \cdot L^2$, where $\rho$ is the resistivity of aluminum, $\epsilon_o$ is the dielectric constant of a vacuum, $\kappa_{ox}$ is the dielectric constant of $SiO_2$, and L is the length of each wire.

Figure 20:
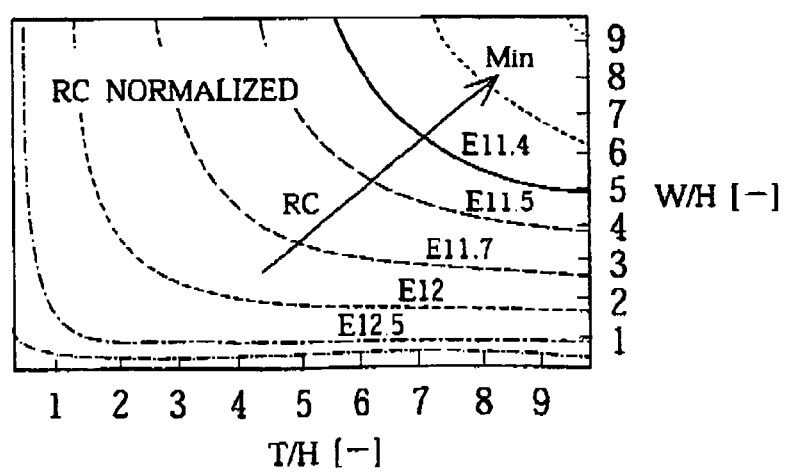
FIG. 20 is a two-dimensional graph showing the distribution of FIG. 19.

FIG. 20 is a two-dimensional projection of the three-dimensional distribution of FIG. 19. Contour lines of FIG. 20 indicate that W/H and T/H must be increased to reduce RC.

Figure 21:
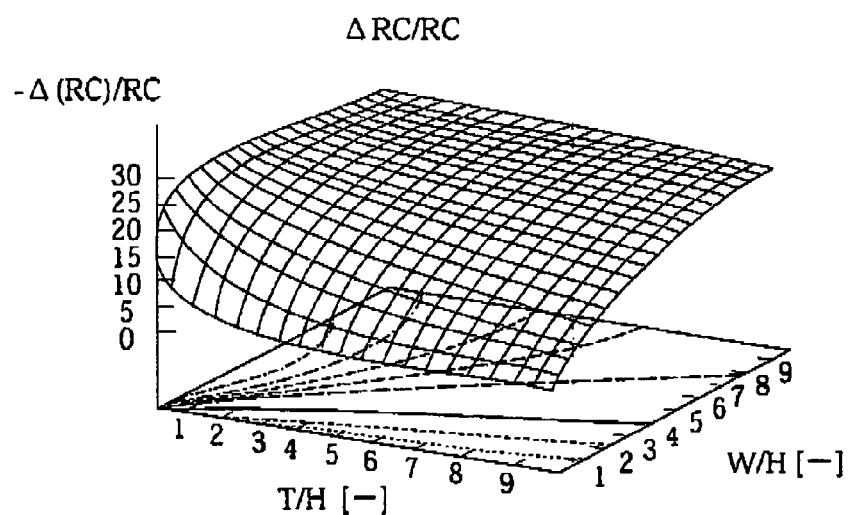
FIG. 21 is a three-dimensional graph showing relationships among the Δ(RC)/(RC), W/H, and T/H of a wiring structure.
Figure 22:
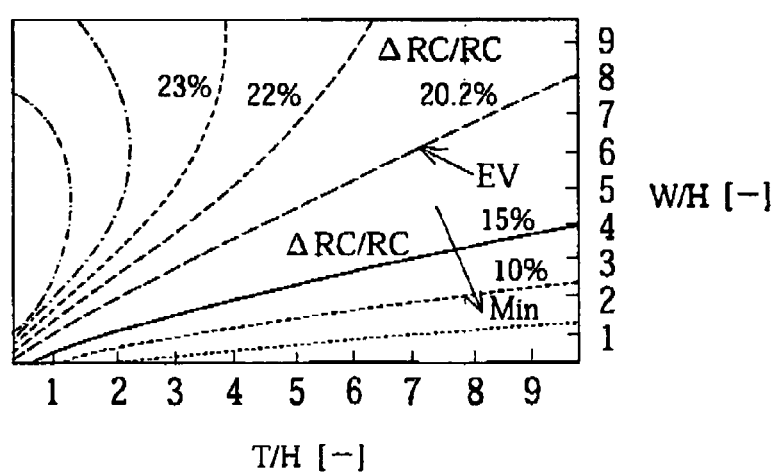
FIG. 22 is a two-dimensional graph showing the distribution of FIG. 21.

FIG. 21 is a graph showing the resistance-by-capacitance variation ratio $\Delta(RC)/(RC)$ of a wiring structure. An x-axis represents T/H values, a y-axis W/H values, and a z-axis $-\Delta(RC)/(RC)$ values. FIG. 22 is a graph showing a two-dimensional projection of the three-dimensional distribution of FIG. 21. A line EV corresponds to the equivalent-variations condition. Contour lines of FIG. 22 show that $\Delta(RC)/(RC)$ decreases as W/H decrease.

Figure 23:
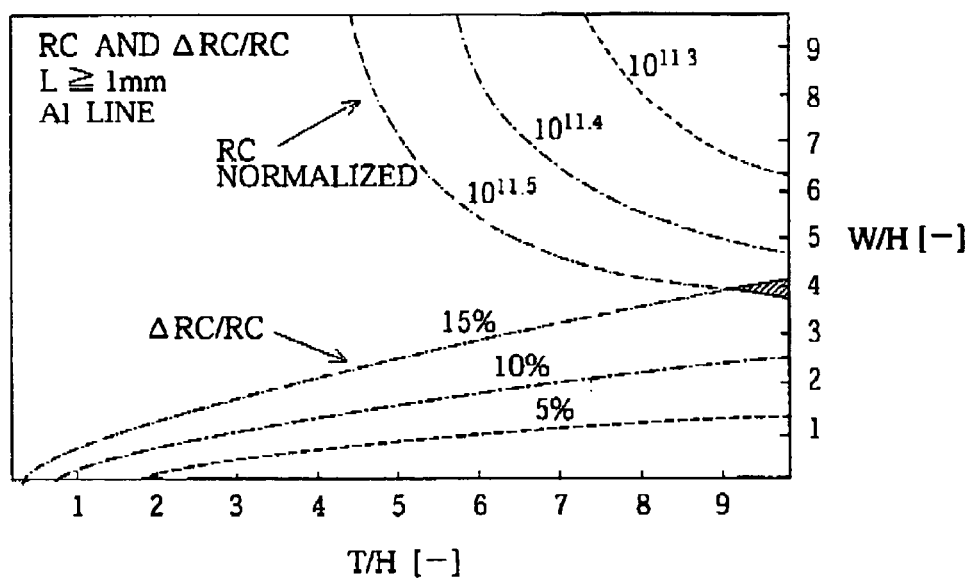
FIG. 23 is a graph showing relationships among the RC, Δ(RC)/(RC), W/H, and T/H of a wiring structure.

FIG. 23 is an overlapped view of FIGS. 20 and 22 and is usable to find a wiring structure capable of simultaneously suppressing RC and $\Delta(RC)/(RC)$.

Generally, a super-high-speed LSI involves a delay of about 1 nsec for 1 mm due to the resistance-by-capacitance RC of a wiring structure of the LSI. This delay corresponds to a normalized RC value of $10^{11.5}$ in FIG. 23 according to parallel-plate approximation for a single wire without considering fringe capacitance. Accordingly, it is preferable to reduce the RC value below $10^{11.5}$ to suppress the delay caused by RC when designing a wiring structure.

On the other hand, a target value of $\Delta(RC)/(RC)$ is, for example, 15% or below. A wiring structure that satisfies the above two requirements is in a hatched area of FIG. 23. This hatched area corresponds to W/H of about 4 and T/H of about 9 to 10. Any wiring structure that meets these conditions is capable of suppressing RC and $\Delta(RC)/(RC)$ caused by process-originated variations.

Example 2

This example relates to a method of desigining a wiring structure having long copper (Cu) wires.

Figure 26A:
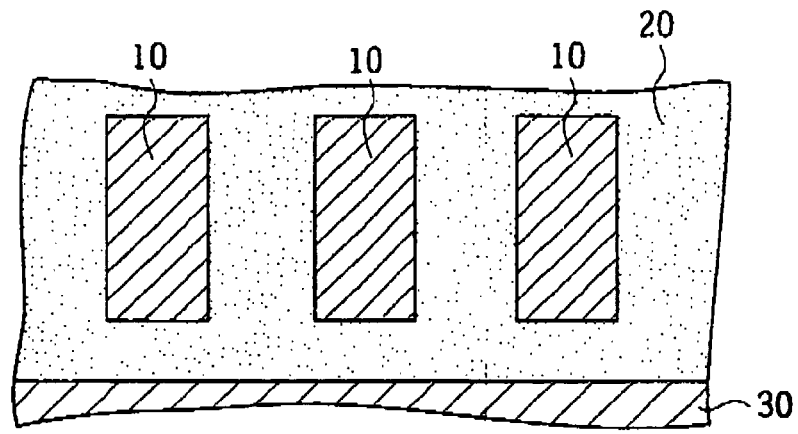
FIGS. 26A to 26C are sectional views showing wiring structures having long wires.

FIG. 26A shows a wiring structure that satisfies the conditoins of the hatched area of FIG. 23. Such a wiring structure is capable of simultaneously suppressing RC and $\Delta(RC)/(RC)$. However, the ratio of the width W of a wire to the thickness T thereof is 4:9 to 4:10, to provide a large aspect ratio (T/W). Any wiring pattern having a large aspect ratio is not preferable for trenching and etching processes.

To solve the problem of large aspect ratio, stuides have been made on different wiring and insulating materials to simultaneously suppress RC and $\Delta(RC)/(RC)$ and provide a proper aspect ratio that is acceptable for the trenching and etching processes.

Figure 24:
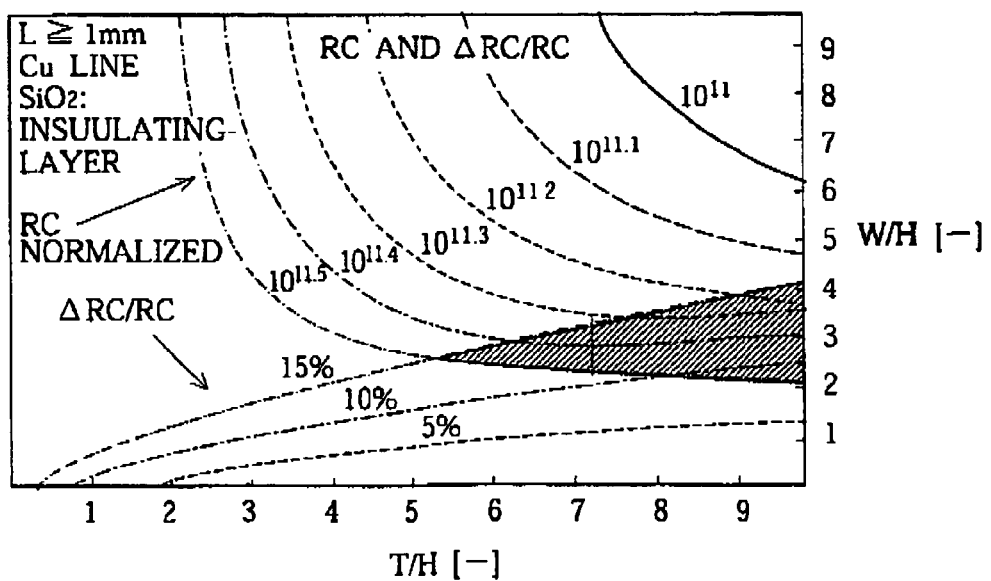
FIG. 24 is a graph showing relationships among the RC, Δ(RC)/(RC), W/H, and T/H of a wiring structure employing copper wires.

A first study is to change the material of each wire of a wiring structure from aluminum (Al) to copper (Cu) whose resistivity is smaller than that of aluminum. Small resistivity enables the thickness T of each wire to be thinned while keeping the same resistance value. FIG. 24 is a graph showing relationships among the RC, $\Delta(RC)/(RC)$, T/H, and W/H of a wiring structure having copper wires. Copper wires have a resistivity $\rho_{Cu}$ of 1.7 $\mu\Omega$-cm and aluminum wires have a resistivity $\rho_{Al}$ of 3.0 $\mu\Omega$-cm, and therefore, $\rho_{Cu}/\rho_{Al}$ is about 0.5, which is used for calculations.

In FIG. 24, the copper wires greatly decrease RC contour lines with respect to W/H values. As a result, a hatched area in which RC is suppressed below $10^{11.5}$ and $\Delta(RC)/(RC)$ below 15% becomes larger than that of FIG. 23. This widens the selection ranges of W/H and T/H values. Namely a process window is widen.

Any wiring structure that suppresses RC below $10^{11.5}$ and $\Delta(RC)/(RC)$ below 15% has W/H of about 2 to 4 and T/H of about 5 to 10, to improve an aspect ratio (T/W).

In this way, changing aluminum wires to copper wires in a wiring structure employing long wires helps improve the aspect ratio of each wiring pattern.

Example 3

This example relates to a wiring structure that involves long wires and employs different materials for insulating layers between horizontally adjacent wires and insulating layers between vertically adjacent wires.

As mentioned above, changing aluminum wires to copper wires widens a process window and improves the aspect ratio of each wire. To realize an ideal aspect ratio of 1:1, a study is made to replace a part of an insulating layer from $SiO_2$ to SiN. Namely, an insulating layer that determines coupling capacitance $C_{21}$ (Refer to FIG. 2) between horizontally adjacent wires is formed from SiN having a high dielectric constant.

The coupling capacitance $C_{21}$ between horizontally adjacent wires is dependent on the thickness T of each wire and the dielectric constant of an insulating layer between the adjacent wires. Accordingly, increasing the dielectric constant of the insulating layer may increase the coupling capacitance $C_{21}$. This results in increasing the capacitance C of each wire and relaxing the resistance-by-capacitance variation ratio $\Delta(RC)/(RC)$ of the wiring structure. Increasing the coupling capacitance $C_{21}$ may help decrease the thickness T relative to the width W of each wire.

Figure 25:
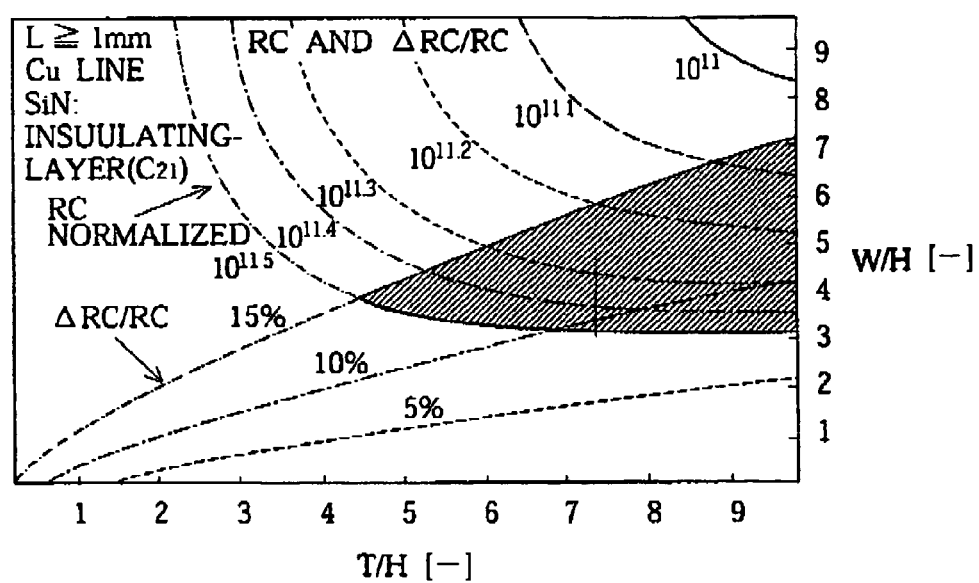
FIG. 25 is a graph showing relationships among the RC, Δ(RC)/(RC), W/H, and T/H of a wiring structure employing copper wires and horizontal insulating films of SiN.

FIG. 25 is a graph showing a wiring structure employing copper wires and an insulating layer made of SiN instead of $SiO_2$ between horizontally adjacent wires. The dielectric constant $\epsilon(SiO_2)$ of $SiO_2$ is 3.9 and the dielectric constant $\epsilon(SiN)$ of SiN is 6.7. Accordingly, $\epsilon(SiN)/\epsilon(SiO_2)$ of about 2 is used for calculations to prepare the graph of FIG. 25.

In FIG. 25, a selective range of $\Delta(RC)/(RC)$ is expanded to expand a process window (hatched area) of FIG. 25 larger than that of FIG. 24. As a result, a wiring structure may have W/H and T/H values of each 5, to provide a good aspect ratio W:T of 1:1.

Figure 26B:
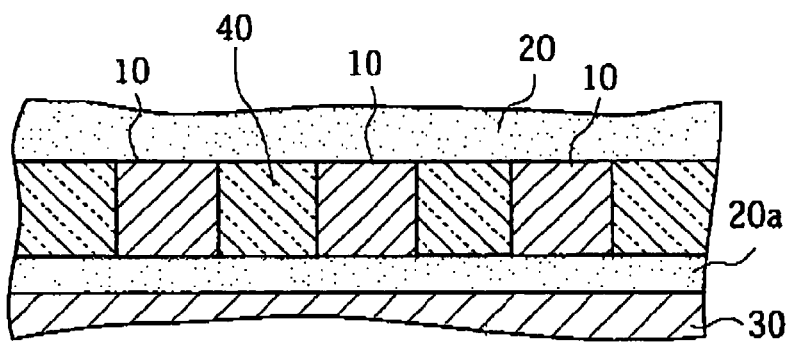

FIG. 26B shows a wiring structure thus formed. Each wire 10 is made of copper, and an insulating film 40 between horizontally adjacent wires is made of SiN. Other insulating layers 20a and 20b are made of $SiO_2$.

According to the prior arts, insulating layers in both the horizontal and vertical directions are made of the same material. On the other hand, this example of the present invention employs different materials for horizontal and vertical insulating layers if the wiring structure involves wires of 1 mm or longer. Namely, the present invention forms each insulation layer between horizontally adjacent wires from a material having a high dielectric constant, to suppress $\Delta(RC)/(RC)$. In addition, the present invention employs copper wires to simultaneously suppress RC and $\Delta(RC)/(RC)$, to provide a good aspect ratio for each wire.

Although this example of the present invention employs $SiO_2$ for an insulating layer between vertically adjacent wires and SiN for an insulating layer between horizontally adjacent wires, the present invention is not limited to these insulating materials. The same effect is achievable if a mean dielectric constant of the insulating layer between horizontally adjacent wires is higher than a mean dielectric constant of the insulating layer between vertically adjacent wires.

Accordingly, there will be many combinartions of insulating materials for forming these insulating layers of this example of the present invention. FIG. 35 is a table showing insulating materials and their resistivity values applicable to form the insulating layers on the present invention.

In FIG. 26B, each insulating layer 20 for vertical insulation may be made of FSG (Fluorine-doped Spin-on-glass) whose dielectric constant is lower than that of $SiO_2$. In this case, each insulating layer 40 for horizontal insulation may be made of $SiO_2$.

Namely, the above-mentioned effect of the present invention is achievable without using material such as SiN of high dielectric constant. To reduce RC, it is preferable to employ low-dielectric-constant materials. For example, the insulating layer 20 may be made of HSQ (Hydrogen Silses Quioxane) having a dielectric constant of 3.2 and the insulating layer 40 of FSG having a dielectric constant of 3.6, to further suppress RC.

The insulating layer 20 may be made of polyimide-based resin having a dielectric constant of 3 or below, or a newly developed material having a dielectric material of 2.5 or below, or a new material to be developed having a dielectric constant of 1.0, to reduce C and RC.

Figure 26C:
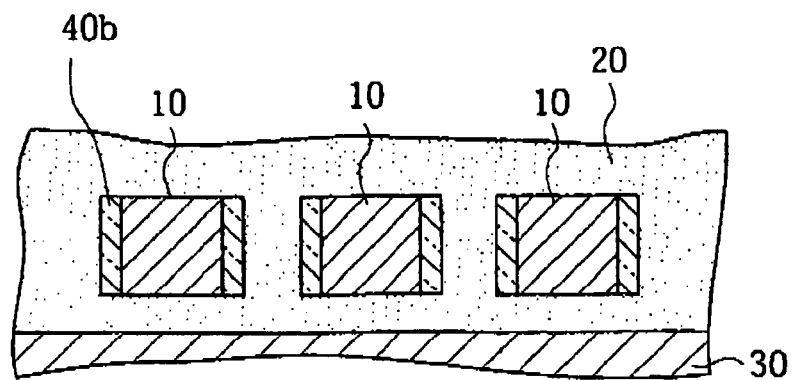

FIG. 26C shows a wiring structure having insulating layers for vertical insulation and insulating layers for horizontal insulation whose dielectric constant is higher than that of the insulating layers for vertical insulation. Each of the insulating layers for horizontal insulation is partly provided with an insulating film 40b having a high dielectric constant. This structure is capable of increasing a mean dielectric constant of the insulating layer, increasing coupling capacitance $C_{21}$ (Refer to FIG. 2), and providing the same effect as the structure of FIG. 26B. For example, the wiring structure of FIG. 26C consists of an insulating layer 20 made of $SiO_2$, wires 10 made of copper (Cu), and an insulating film 40b of SiN formed on the side wall of each wire 10. By controlling the thickness of the insulating film 40b, it is possible to adjust the coupling capacitance $C_{21}$. In this way, the insulating layer formed between horizontally adjacent wires is not limited to a monolayer structure. It may have a multilayer structure.

The insulating film 40b of FIG. 26C is formed according to standard processes. When using a damascene method to form a wiring layer, trenches are formed on an insulating layer. The inner wall of each of the trenches is coated with a high-dielectric material 40b by spattering or coating technique. Anisotropic RIE (reactive ion etching) is carried out to selectively etch the film on the bottom of each trench without removing the dielectric material 40b on the sidewall of each trench. Thereafter, the trenches are buried to form wires according to a known technique.

Materials to form the insulating layer 20 and insulating film 40b of FIG. 26C may be selected from the table of FIG. 35 or from any other materials. For example, the insulating layer 20 may be made of HSQ and the insulating film 40b of FSG, to reduce the total capacitance C of the wiring structure.

Example 4

This example relates to a method of designing a wiring structure capable of simultaneously suppressing the capacitance C and capacitance variation ratio $\Delta C/C$ of the wiring structure.

A delay time in an LSI circuit involving wires shorter than 1 mm is determined by the product of a transistor ON resistance Rtr and a wiring capacitance C. Namely, the operation of the LSI circuit is influenced by the capacitance C and capacitance variation ratio $\Delta C/C$ of the wiring structure of the LSI circuit. It is important, therefore, to suppress the C and $\Delta C$ of the wiring structure that includes short wires.

A wiring structure that employs aluminum as wiring material and $SiO_2$ as insulating material will be explained. The wiring structure is subjected to process-originated variations including a wire-width variation $\Delta W$ of =10% and a wire-thickness variation $\Delta T$ of ±10%.

Figure 27:
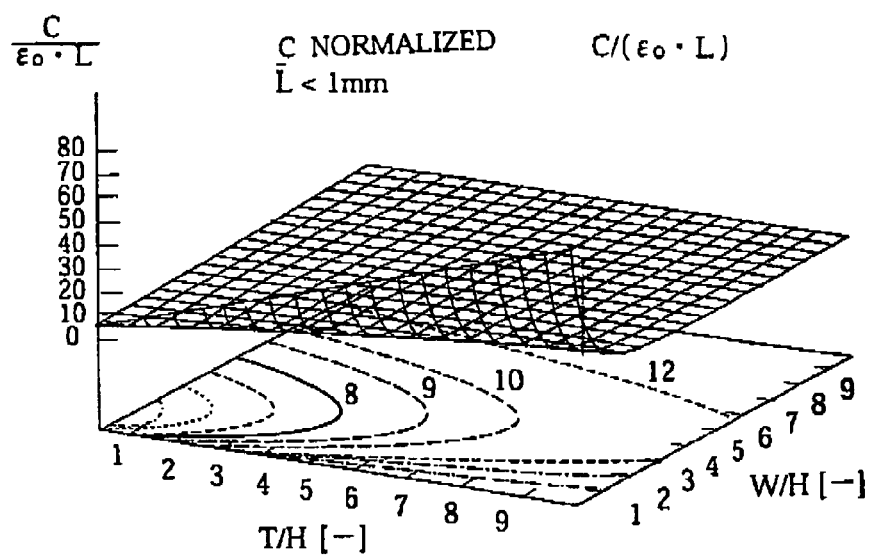
FIG. 27 is a three-dimensional graph showing relationships among the C, W/H, and T/H of a wiring structure.
Figure 28:
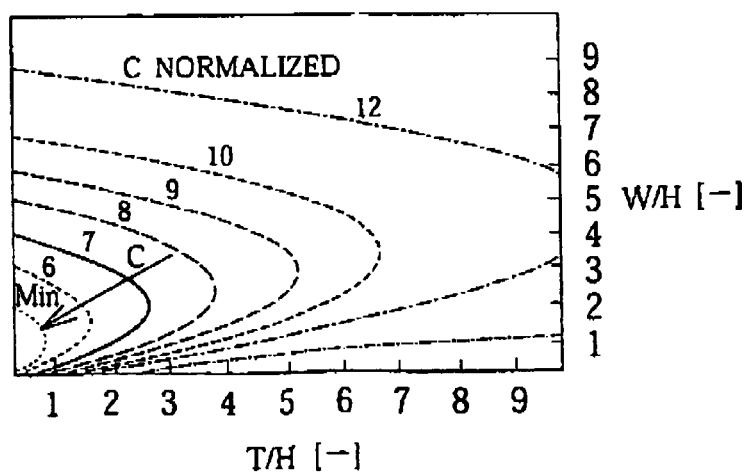
FIG. 28 is a two-dimensional graph showing the distribution of FIG. 27.

FIG. 27 is a graph showing the capacitance C of the wiring structure with an x-axis representing wire-thickness-to-insulating-film-thickness ratios T/H, a y-axis wire-width-to-insulating-film-thickness ratios W/H, and a z-axis C values. The values of C are normalized according to $\epsilon_o \cdot L$. FIG. 28 is a two-dimensional projection of the three-dimensional distribution of FIG. 27. Contour lines of FIG. 28 indicate that C is small if both the W/H and T/H values are small.

Figure 29:
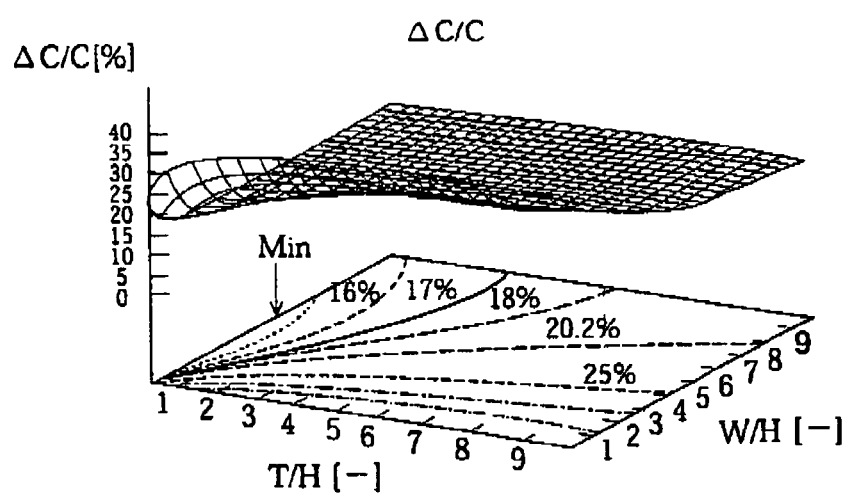
FIG. 29 is a three-dimensional graph showing relationships among the ΔC/C, W/H, and T/H of a wiring structure.
Figure 30:
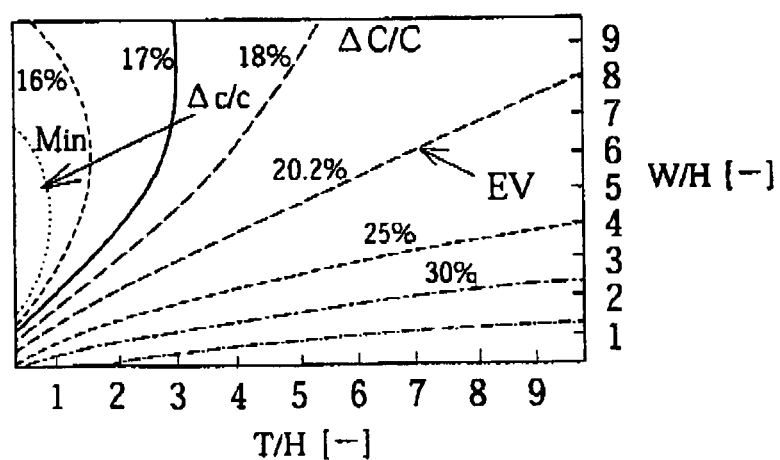
FIG. 30 is a two-dimensional graph showing the distribution of FIG. 29.

FIG. 29 is a graph showing the capacitance variation ratio $\Delta C/C$ of the wiring structure with an x-axis representing W/H values, a y-axis, T/H values, and a z-axis $\Delta C/C$ values. FIG. 30 is a two-dimensional projection of the three-dimensional distribution of FIG. 29. In FIG. 30, a line EV indicates the equivalent-variations condition. Contour lines of FIG. 30 indicate that T/H values must be reduced to suppress $\Delta C/C$.

Figure 31:
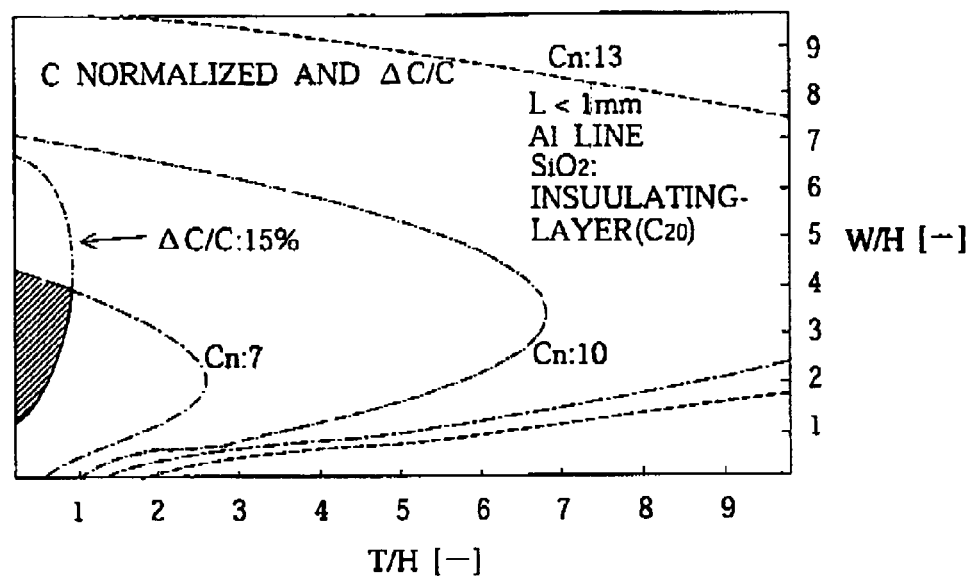
FIG. 31 is a graph showing relationships among the C, ΔC/C, W/H, and T/H of a wiring structure.

FIG. 31 is an overlapped view of FIGS. 28 and 30 and is usable to find a wiring structure capable of simultaneously suppressing the capacitance C and capacitance variation ratio $\Delta C/C$ of the wiring structure.

For example, a target normalized capacitance value $C/(\delta_o \cdot L)$ is 7 or below and a target $\Delta C/C$ value is 15% or below. In this case, a hatched area of FIG. 31 corresponds to preferable wiring conditions. Namely, a preferable wiring structure has W/H of about 1.5 to 4 and T/H of about 0.8 or below, to have small C and $\Delta C/C$ against process-originated variations. An example of such a preferable wiring structure is shown in FIG. 33A.

Example 5

This example relates to a wiring structure having short wires made of copper (Cu) and employing different materials for insulating layers for horizontal insulation and insulating layers for vertical insulation.

Figure 33A:
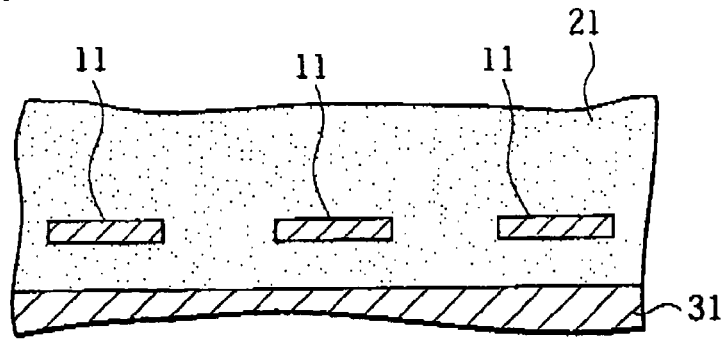
FIGS. 33A to 33D are sectional views showing wiring structures employing short wires.

The wiring structure of FIG. 33A designed as mentioned above may simultaneously suppress C and $\Delta C/C$. However, if the thickness H of the insulating film formed under the wires is fixed, a width-to-thickness ratio W:T of each wire is 4:1 to 8:1 to provide a small aspect ratio (T/W). Namely, the thickness of a wire is too small compared with the width thereof.

A wire having such a small aspect ratio is wide to require a large area on a substrate. This is not preferable to form a fine LSI.

In a multilayer wiring structure, lower wiring layers usually involve short and fine wires, and therefore, an excessively small aspect ratio is a problem. It is required, therefore, to narrow the width W of each wire. To reduce the width W of a wire without increasing the resistance R thereof, the material of the wire may be changed from aluminum (Al) to copper (Cu) having lower resistivity.

If the width W of a wire is reduced without changing the thickness T thereof, the coupling capacitance $C_{21}$ (Refer to FIG. 2) of the wire may drop to reduce the total capacitance C of wiring and increase the capacitance variation ratio $\Delta C/C$ of the wiring. Accordingly, it is preferable to reduce $\Delta C/C$ by increasing the wire-to-ground capacitance $C_{20}$ (Refer to FIG. 2) of the wire without widening the wire.

Figure 32:
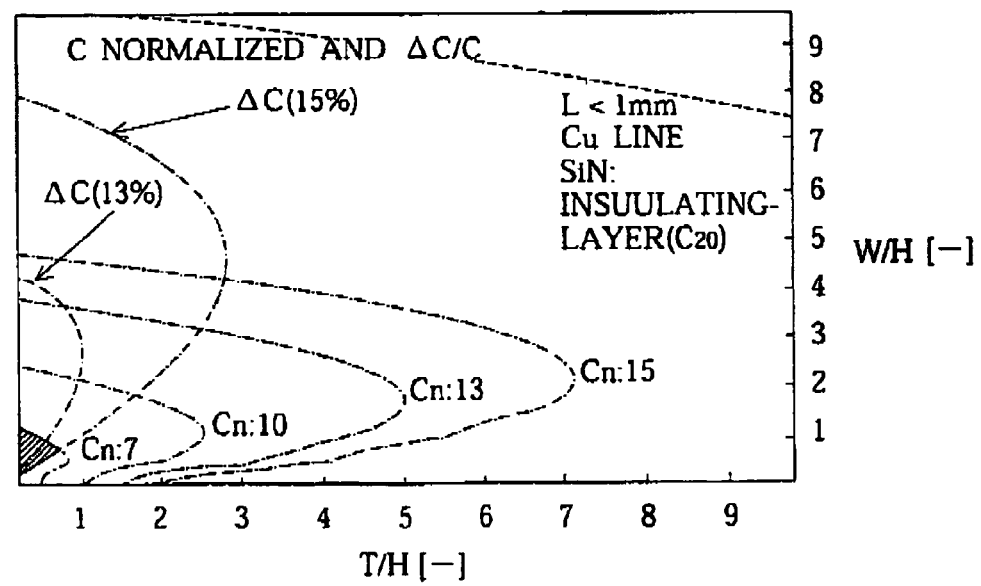
FIG. 32 is a graph showing relationships among the C, ΔC/C, W/H, and T/H of a wiring structure employing copper wires and an insulating film of SiN under the copper wires.

More precisely, the material of wires is changed from aluminum to copper, and the material of an insulating layer laid under the wires is changed from $SiO_2$ to SiN. FIG. 32 shows the characteristics of such a wiring structure. Although a process window (hatched area) of FIG. 32 is smaller than that of FIG. 31, SiN increases the wire-to-ground capacitance $C_{20}$ and shifts the process window toward a smaller width side. For example, a wiring structure of W/H of about 1 and T/H of about 0.5 improves the aspect ratio W:T up to 2:1.

Figure 33B:
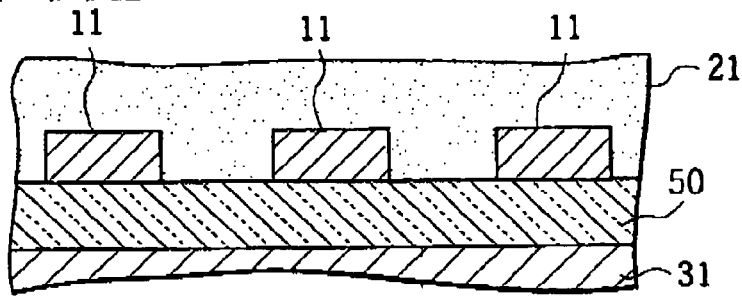

FIG. 33B is a sectional view showing the wiring structure of improved aspect ratio. Each wire 11 is made of copper, an insulating film 50 of SiN of high dielectric constant, and an insulating layer 21 of $SiO_2$. A base layer 31 may be a lower wiring layer or a substrate.

According to the prior arts, insulating layers for horizontal and vertical insulation are made of the same material. On the other hand, this example of the present invention employs different materials for insulating layers for horizontal and vertical insulation in a wiring structure that contains wires shorter than 1 mm. In this example, a dielectric constant of vertical insulating layer is higher than a dielectric constant of horizontal insulating layer. At the same time, this example forms the wires from copper having low resistivity, to simultaneously suppress the capacitance C and capacitance variation ratio $\Delta C/C$ of the wiring structure against process-originated variations, as well as realizing an aspect ratio that is appropriate for fine processes.

Although this example of the present invention uses $SiO_2$ for insulating films for horizontal insulation and SiN for insulating films for vertical insulation, the present invention is not limited to these materials. The same effect is achievable if a mean dielectric constant of the insulating layers for vertical insulation is higher than a mean dielectric constant of the insulating layers for horizontal insulation.

Figure 33C:
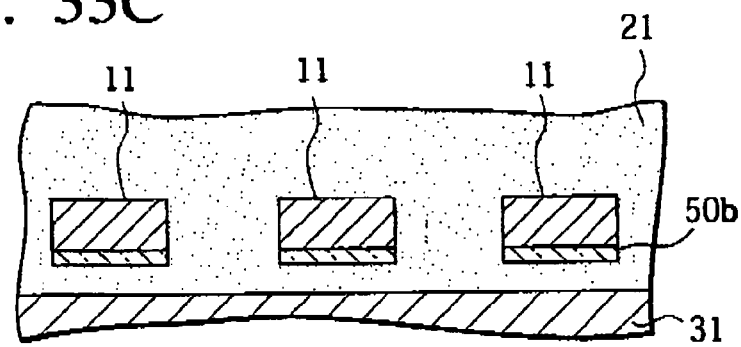

FIG. 33C shows a wiring structure in which the dielectric constant of insulating layers for vertical insulation is higher than that of insulating layers for horizontal insulation. According to this structure, each wire 11 is made of copper, and an insulating film 50b made of, for example, SiN having a high dielectric constant is formed on the bottom of the wire 11. Another insulating layer 21 is made of $SiO_2$ like the prior art.

With the insulating film 50b of high dielectric constant being partly provided for an insulating layer for vertical insulation, the wiring structure of this example increases the actual dielectric constant of the insulating layer for vertical insulation to increase wire-to-ground capacitance $C_{20}$. As a result, this example provides the same effect as the wiring structure of FIG. 33B.

By controlling the thickness of the insulating film 50b of FIG. 33C, it is possible to adjust coupling capacitance $C_{21}$, too.

To form the insulating film 50b on the bottom of each wire 11, a layer of the insulating film 50b is formed on an insulating layer and is patterned. A second insulating layer is formed on the insulating film 50b, trenches are formed in the second insulating layer to expose the insulating film 50b, and the trenches are buried with wiring material to form the wires 11.

The insulating film 50b may not be in direct contact with the bottom of the wire 11. It is sufficient if the insulating film 50b is formed in a part of the insulating layer for vertical insulation. Also, it is not necessary to align the insulating film 50b with the wire 11 in a plan view.

Figure 33D:
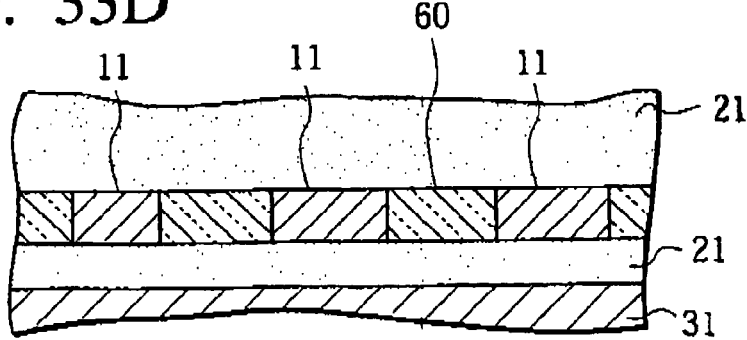

FIG. 33D shows a wiring structure having insulating layers for horizontal insulation and insulating layers for vertical insulation whose dielectric constant is higher than that of the insulating layers for horizontal insulation.

The insulating film 21 for vertical insulation is made of $SiO_2$ and the insulating layer 60 for horizontal insulation is made of low-dielectric-constant material. As a result, the dielectric constant of the insulating layer 21 is relatively higher than that of the insulating layer 60. The insulating layer 60 of low dielectric constant may be made of FSG (fluorine-doped spin-on-glass).

This example makes the dielectric constant of the insulating layer 21 for vertical insulation higher than that of the insulating layer 60 for horizontal insulation without using high-dielectric material such as SiN. To reduce the capacitance C of wiring, it is preferable to use materials of low dielectric constant.

The materials used for this example may be selected from the materials of FIG. 35. For example, the insulating layer 60 may be made of HSQ (hydrogen silsequioxane) having a dielectric constant of 3.2, and the insulating layer 21 may be made of FSG having a dielectric constant of 3.6, to reduce the total capacitance C of the wiring structure in addition to providing the above-mentioned effect.

The insulating layer 60 may be made of polyimide-based resin having a dielectric constant of 3 or below, or a newly developed material having a dielectric material of 2.5 or below, or a new material to be developed having a dielectric constant of 1.0, to reduce the total capacitance C of the wiring structure and a circuit delay time.

As mentioned above, this example forms wires with copper and increases the dielectric constant of insulating layers for vertical insulation relative to that of insulating layers for horizontal insulation, to simultaneously suppress the capacitance C and capacitance variation ratio $\Delta C/C$ of the wiring structure and realize a good aspect ratio appropriate for fine processes. Since this example simultaneously suppresses C and $\Delta C/C$ that are main factors to cause a circuit delay, it realizes proper circuit delay characteristics agains process-originated variations.

Example 6

This example relates to a multilayer wiring structure that is a combination of the examples 1 to 5.

The examples 1 to 5 provide a wiring structure having short or long wires. As actual semiconductor device, however, usually has a multilayer structure involving both the long and short wores. A standard multilayer wiring structure forms transistors and memories directly on a semiconductor substrate, and short wires in lower layers, the lengths of wires being gradually elongaed toward upper layers.

Figure 34A:
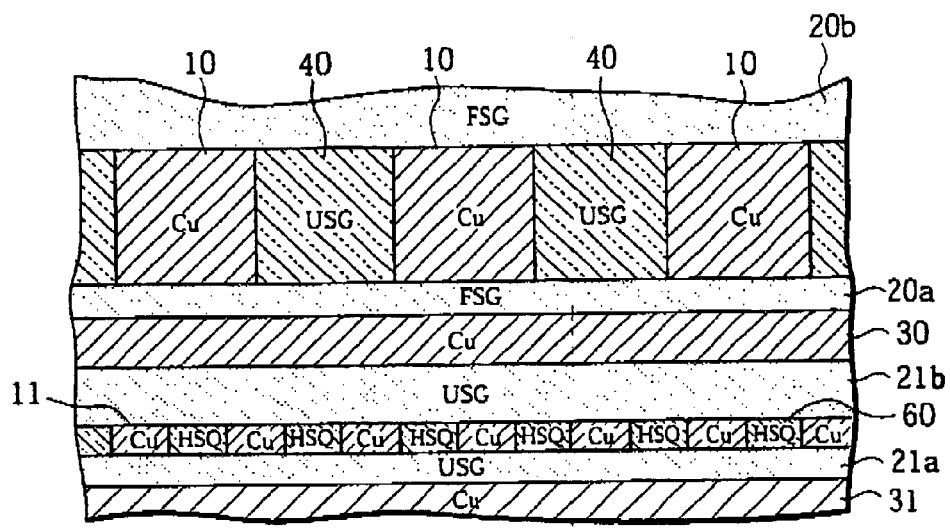
FIGS. 34A and 34B are sectional views showing wiring structures having multiple wiring layers.

FIG. 34A is a sectional view showing a multilayer wiring structure. Wires 10 are formed in an upper layer and wires 11 are formed in a lower layer. Both the wires 10 and 11 are made of copper (Cu).

The wires 11 in the lower layer are each shorter than 1 mm. Between a substrate 31 and the wires 11, there is an insulating layer 21a for veritcal insulation made of USG having a dielectric constant of 4.1. An insulating layer 60 for horizontal insulation is made of HSQ having a dielectric constant of 3.2. This results in increasing the dielectric constant of the insulating layer 21a higher than that of the insulating layer 60.

The wires 10 in the upper layer are each equal to or longer than 1 mm. Between a lower wiring layer 30 and the wires 10, there is an insulating layer 20a for vertical insulation made of FSG having a dielectric constant of 3.6. An insulating layer 40 for horizontal insulation is made of USG having a dielectric constant of 4.1. This results in increasing the dielectric constant of the insulating layer 40 higher than that of the insulating layer 20a. Materials for forming the insulating layers are not limited to those mentioned above.

In each of the upper and lower wiring layers of the wiring structure, circuit delay is suppressed against process-originated variations. In addition, the wiring structure provides each wire with an aspect ratio that is appropriate for fine processes. Consequently, this example meets requirements for fine devices and suppresses process-originated variations.

Figure 34B:
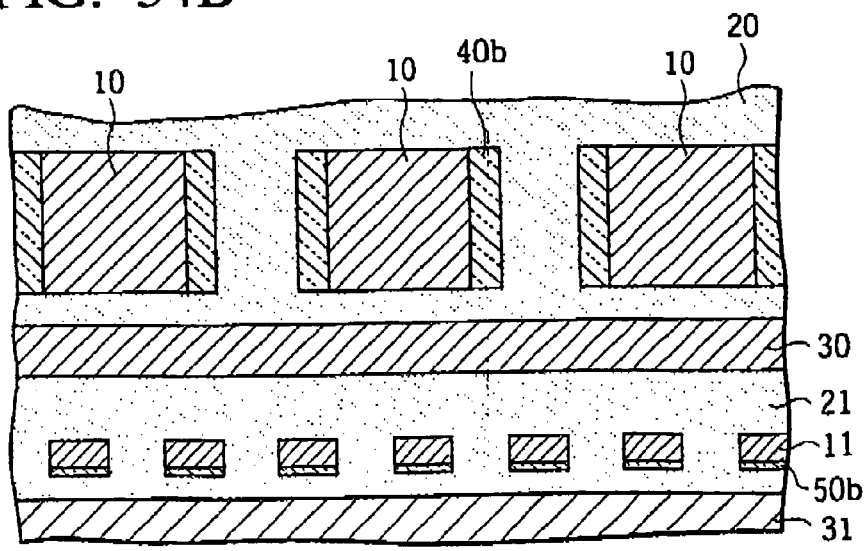

FIG. 34B is a sectional viewl showing another multilayer wiring structure. Upper and lowr wires 10 and 11 are made of copper (Cu). The lower wires 11 are each shorter than 1 mm. The bottom of each wire 11 is provided with an insulating film 50b made of, for example, SiN whose dielectric constant is higher than that of $SiO_2$. The upper wires 10 are each equal to or longer than 1 mm. The side wall of each wire 10 is provided with an insulating film 40b made of SiN. Other insulating layers 20 and 21 are made of $SiO_2$. This example provides the same effect as the example of FIG. 34A.

Materials of the insulating layers are not limited to those mentioned above. They may be selected from the table of FIG. 35 or from other materials.

In an actual semiconductor device, the influence of process-originated variations is more severe on lower-layer wires that are finer than upper-layer wires. Accordingly, it is possible to apply the conditions of the present invention only to the lower-layer wires. For example, only the lower-layer wirs may be made of copper, and the upper-layer wires may be made of aluminum.

A multilayer wiring structure has the problem of crosstalk between vertically adjacent wires. To prevent the crosstalk, the present invention provides a wiring structure that is designed not to vertically closely arrange wiring layers that may cause crosstalk between them.

The aluminum wires mentioned here may contain, in addition to a main component of aluminum, other compounds. Also, the copper wires mentioned here may contain, in addition to a main component of copper, other compounds and may have a barrier metal layer. Wires made of other conductive matierals not mentioned here are also employable for the present invention.

Although the present invention has been explained with reference to the preferred embodiemtns, the present invention is not limited to them, and as is apparent for those skilled in the art, allows various modifications. The wiring structures of the present invention are applicable not only to LSIs but alos to other devices that involve circuit delay and delay variations resulting from fine processes.

What is claimed is:

1. A wiring structure of a semiconductor device, comprising:
 a wiring layer formed on an insulating film, a width (W) of each wire in the wiring layer and a thickness (H) of the insulating film satisfying "W/H$\leq$1", a length (L) of each wire in the wiring layer being equal to or longer than 1 mm.

2. The wiring structure of claim 1, wherein:
 the wiring structure consists of multiple wiring layers; and
 the wires are in third and upper wiring layers.

\* \* \* \* \*